United States Patent
Apalkov et al.

(10) Patent No.: US 9,490,000 B2
(45) Date of Patent: Nov. 8, 2016

(54) METHOD AND SYSTEM FOR PROVIDING THERMALLY ASSISTED MAGNETIC JUNCTIONS HAVING A MULTI-PHASE OPERATION

(71) Applicant: Samsung Electronics Co., LTD., Gyeonggi-do (KR)

(72) Inventors: Dmytro Apalkov, San Jose, CA (US); Roman Chepulskyy, Milpitas, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 44 days.

(21) Appl. No.: 14/563,307

(22) Filed: Dec. 8, 2014

(65) Prior Publication Data

US 2015/0294707 A1 Oct. 15, 2015

Related U.S. Application Data

(60) Provisional application No. 61/978,150, filed on Apr. 10, 2014.

(51) Int. Cl.
| | | |
|---|---|---|
| *G11C 11/16* | (2006.01) | |
| *H01L 43/10* | (2006.01) | |
| *H01L 43/08* | (2006.01) | |

(52) U.S. Cl.
CPC .......... *G11C 11/1675* (2013.01); *H01L 43/08* (2013.01); *H01L 43/10* (2013.01)

(58) Field of Classification Search
CPC . G11C 11/1675; H01L 27/222; H01L 43/02; H01L 43/10
USPC ........................................................ 365/158
See application file for complete search history.

(56) References Cited

U.S. PATENT DOCUMENTS

| | | | |
|---|---|---|---|
| 6,771,534 B2 * | 8/2004 | Stipe | B82Y 10/00 257/E21.665 |
| 7,110,287 B2 | 9/2006 | Huai | |
| 7,852,664 B2 | 12/2010 | Chen | |
| 7,929,370 B2 | 4/2011 | Min | |
| 8,541,855 B2 | 9/2013 | Jan et al. | |
| 2004/0095801 A1 * | 5/2004 | Stipe | B82Y 10/00 365/158 |

(Continued)

OTHER PUBLICATIONS

"Enhanced Thermal Stability in Perpendicular Top-Pinned Magnetic Tunnel Junction with Synthetic Antiferromagnetic Free Layers," Yoshida et al., IEEE Transactions on Magnetics, vol. 49, No. 7, Jul. 2013.

*Primary Examiner* — Khamdan Alrobaie
*Assistant Examiner* — Xiaochun L Chen
(74) *Attorney, Agent, or Firm* — Convergent Law Group LLP

(57) ABSTRACT

A magnetic junction usable in magnetic devices is described. The magnetic junction includes at least one reference layer, at least one nonmagnetic spacer layer and a free layer. The nonmagnetic spacer layer(s) are between the reference layer(s) and the free layer. The free layer has a magnetic thermal stability coefficient having a plurality of magnetic thermal stability coefficient phases. A first phase magnetic thermal stability coefficient has a first slope below a first temperature. A second phase magnetic thermal stability coefficient has a second slope above the first temperature and below a second temperature greater than the first temperature. The first and second slopes are unequal at the first temperature. The magnetic thermal stability coefficient is zero only above the second temperature. The free layer is switchable between stable magnetic states when a write current passed through the magnetic junction.

17 Claims, 9 Drawing Sheets

(56) References Cited

U.S. PATENT DOCUMENTS

| | | |
|---|---|---|
| 2010/0055502 A1 | 3/2010 | Kubota |
| 2012/0063218 A1 | 3/2012 | Huai |
| 2012/0205758 A1 | 8/2012 | Jan |
| 2012/0250404 A1 | 10/2012 | Wang |
| 2013/0119498 A1 | 5/2013 | Huai |
| 2013/0148419 A1 | 6/2013 | Prejbeanu |
| 2013/0154035 A1 | 6/2013 | Krounbi et al. |
| 2013/0230741 A1 | 9/2013 | Wang |
| 2013/0270523 A1 | 10/2013 | Wang |

* cited by examiner

METHOD AND SYSTEM FOR PROVIDING THERMALLY ASSISTED MAGNETIC JUNCTIONS HAVING A MULTI-PHASE OPERATION

CROSS-REFERENCE TO RELATED APPLICATIONS

This application claims the benefit of provisional Patent Application Ser. No. 61/978,150, filed Apr. 10, 2014, entitled THERMAL ASSIST MAGNETIC TUNNEL JUNCTION WITH TWO PHASE OPERATION, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO. Alternatively, a conductive layer maybe used instead of the conventional tunneling barrier layer 18.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be anti-parallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-MRAM are desired. Accordingly, what is needed is a method and system that may improve the performance of the spin transfer torque based memories. The method and system described herein address such a need.

BRIEF SUMMARY OF THE INVENTION

A method and system for providing a magnetic junction usable in an electronic device are described. The magnetic junction includes at least one reference layer, at least one nonmagnetic spacer layer and a free layer. The nonmagnetic spacer layer(s) are between the reference layer(s) and the free layer. The free layer has a magnetic thermal stability coefficient $\Delta$ having a plurality of magnetic thermal stability coefficient phases. A first phase magnetic thermal stability coefficient has a first slope below a first temperature. A second phase magnetic thermal stability coefficient has a second slope above the first temperature and below a second temperature greater than the first temperature. The first slope and second slope unequal at the first temperature. The magnetic thermal stability coefficient is zero above the second temperature and greater than zero below the second temperature. The free layer is switchable between stable magnetic states when a write current is passed through the magnetic junction.

DETAILED DESCRIPTION OF THE INVENTION

Figure 1:
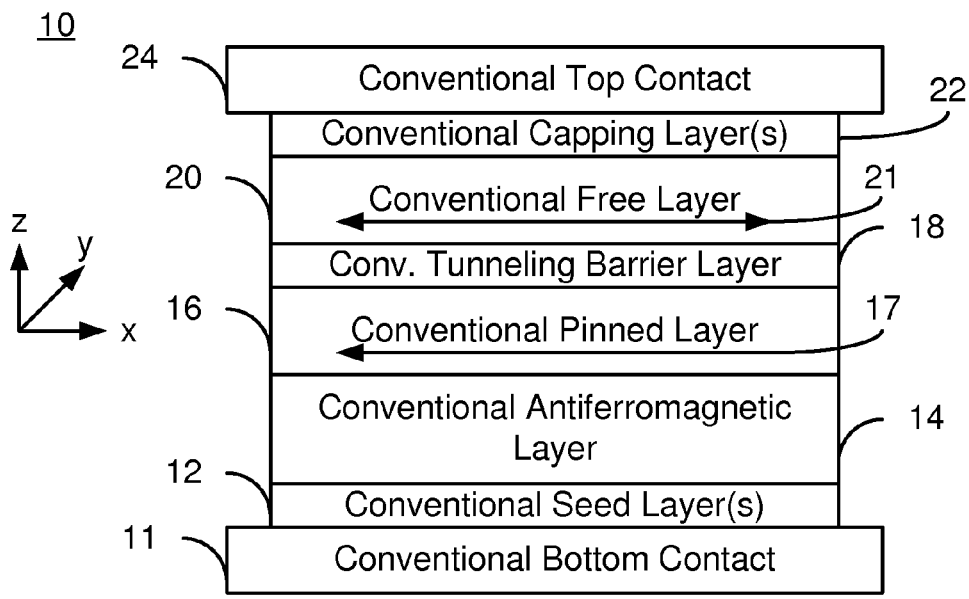
FIG. 1 depicts a conventional magnetic junction.

The exemplary embodiments relate to magnetic junctions usable in electronic devices, such as those using magnetic memories, and other devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments include magnetic junction(s) usable in magnetic device(s). For example, the magnetic junction(s) may be within magnetic storage cells for a magnetic memory programmable using spin transfer torque. The magnetic memories may be usable in electronic devices that make use of nonvolatile storage. Such electronic devices include but are not limited to cellular phones, tablets, and other mobile computing devices. A method and system for providing a magnetic junction usable in an electronic device are described. The magnetic junction includes at least one reference layer, at least one nonmagnetic spacer layer and a free layer. The nonmagnetic spacer layer(s) are between the reference layer(s) and the free layer. The free layer has a magnetic thermal stability coefficient having a plurality of magnetic thermal stability coefficient phases. A first phase magnetic thermal stability coefficient has a first slope below a first temperature. A second phase magnetic thermal stability coefficient has a second slope above the first temperature and below a second temperature greater than the first temperature. In some embodiments, at least a portion of the first slope is more negative than at least a portion of the second slope. The first slope and second slope unequal at the first temperature. The magnetic thermal stability coefficient is zero above the second temperature and greater than zero below the second temperature. The free layer is switchable between stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
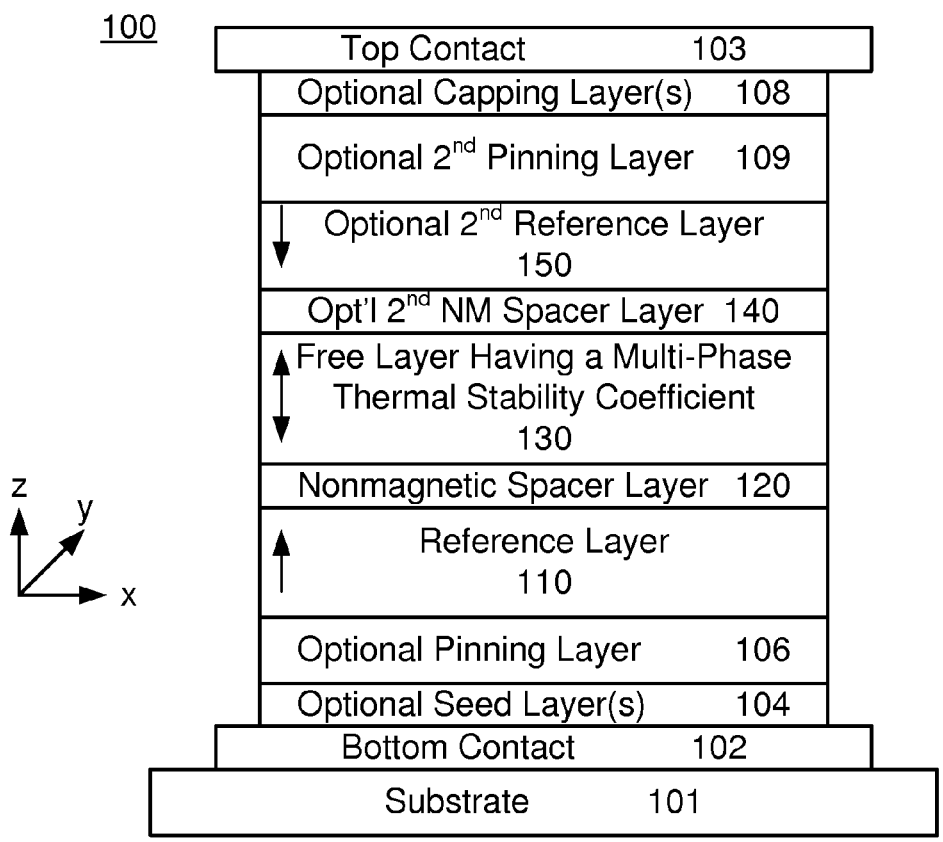
FIG. 2 depicts an exemplary embodiment of a magnetic junction usable in a magnetic memory programmable using spin transfer torque and which includes a free layer having a multi-phase magnetic thermal stability coefficient.

FIG. 2 depicts an exemplary embodiment of a magnetic junction 100 as well as surrounding structures. For clarity, FIG. 2 is not to scale. The magnetic junction may be used in a magnetic device such as a spin transfer torque random access memory (STT-MRAM) and, therefore, in a variety of electronic devices. The magnetic junction 100 includes a reference layer 110, a nonmagnetic spacer layer 120, a free layer 130 and optional additional nonmagnetic spacer layer 140 and an optional additional reference layer 150. The magnetic junction 100 may also include optional seed layer(s) 104, optional pinning layer 106 for reference layer 110, optional pinning layer 109 for optional reference layer 150 and optional capping layer(s) 108. Also shown is an underlying substrate 101, bottom contact 102 and optional top contact 103. Devices including but not limited to a transistor may be formed in the substrate 101. If the layers 140 and 150 are omitted, the magnetic junction 100 is a single magnetic junction. If layers 140 and 150 are included, the magnetic junction 100 is a dual magnetic junction. Although layers 110, 120, 130, 140 and 150 are shown with a particular orientation with respect to the substrate 101, this orientation may vary in other embodiments. For example, the reference layer 110 may be closer to the top (furthest from a substrate) of the magnetic junction 100. In such an embodiment (in which layers 140, 150 and 109 are also omitted), the magnetic junction 100 would be a bottom free layer junction. If the reference layer 110 is closest to the substrate 101 and layers 140, 150 and 109 are omitted, the magnetic junction is a top free layer junction. The optional pinning layer(s) 106 and 109 may be used to fix the magnetization of the reference layer(s) 110 and 150, respectively. In some embodiments, the optional pinning layers 106 and 109 may be AFM layers or multilayers that pin the magnetizations of the pinned layers 110 and 150, respectively, by an exchange-bias interaction. However, in other embodiments, the optional pinning layers 106 and 109 may be omitted or another structure may be used. For example, if the perpendicular magnetic anisotropy energy of the reference layer 110 exceeds the out of plane demagnetization energy, the magnetic moment of the reference layer 110 may be out of plane (e.g. perpendicular-to-plane). This situation is shown in FIG. 2. In such embodiments, the pinning layer 106 may be omitted. Similarly, the magnetic moment of the optional reference layer 150 may be out-of-plane (e.g. perpendicular-to-plane) of the perpendicular magnetic anisotropy energy of the layer 150 exceeds the out-of-plane demagnetization energy. The magnetic junction 100 is also configured to allow the free layer 130 to be switched between stable magnetic states when a write current is passed through the magnetic junction 100. Thus, the free layer 130 is switchable utilizing spin transfer torque.

The reference layer 110 is magnetic and may have its magnetization pinned, or fixed, in a particular direction. Although depicted as a simple layer, the reference layer 110 may include multiple layers. For example, the reference layer 110 may be a SAF including magnetic layers antiferromagnetically or ferromagnetically coupled through thin layers, such as Ru. In such a SAF, multiple magnetic layers interleaved with thin layer(s) of Ru or other material may be used. The reference layer 110 may also be another multilayer. In the embodiment depicted in FIG. 2, the reference layer 110 has a perpendicular anisotropy energy that exceeds the out-of-plane demagnetization energy. Thus, the reference layer 110 may have its magnetic moment oriented perpendicular-to-plane as shown. Other orientations of the magnetization of the reference layer 110 are possible. In other embodiments, for example, the magnetic moment of the reference layer 110 may be in-plane. The optional reference layer 150 is analogous to the reference layer 110. Thus, the optional reference layer 150 is magnetic and may have its magnetization pinned, or fixed, in a particular direction. Although depicted as a simple layer, the optional reference layer 150 may include multiple layers. For example, the optional reference layer 150 may be a SAF or other multilayer. In the embodiment depicted in FIG. 2, the optional reference layer 150 has a perpendicular anisotropy energy that exceeds the out-of-plane demagnetization energy. Thus, the optional reference layer 150 may have its magnetic moment oriented perpendicular-to-plane as shown. Other orientations of the magnetization of the optional reference layer 150 are possible. In other embodiments, for example, the magnetic moment of the optional reference layer 150 may be in-plane. There is no requirement that the reference layer 110 and the optional reference layer 150 be the same in a magnetic junction in which both are present.

The spacer layer 120 is nonmagnetic. In some embodiments, the spacer layer 120 is an insulator, for example a tunneling barrier. In such embodiments, the spacer layer 120 may include crystalline MgO, which may enhance the TMR of the magnetic junction as well as the perpendicular magnetic anisotropy of the free layer 130. In other embodiments, the spacer layer 120 may be a conductor, such as Cu. In alternate embodiments, the spacer layer 120 might have another structure, for example a granular layer including conductive channels in an insulating matrix. The optional spacer layer 140 is analogous to the spacer layer 120. Thus, the optional spacer layer 140 is nonmagnetic and may be a tunneling barrier. In such embodiments, the spacer layer 120 may include crystalline MgO. In other embodiments, the spacer layer 120 may be a conductor, such as Cu. In alternate embodiments, the spacer layer 120 might have another structure, for example a granular layer including conductive channels in an insulating matrix. There is, however, no requirement that the spacer layers 120 and 140 be the same if both are present in the magnetic junction 100.

The free layer 130 is magnetic and is written using a current driven through the magnetic junction 100. In some embodiments, the free layer 130 is a multilayer. For example, the free layer 130 maybe a SAF and/or may include multiple adjoining ferromagnetic layers that are exchange coupled. Other multilayers may also be used. The layers in the multilayer may be single elements, alloys, and may include nonmagnetic layers. In other embodiments, the free layer 130 may be a single layer. In the embodiment depicted in FIG. 2, the free layer 130 has a perpendicular anisotropy energy that exceeds the out-of-plane demagnetization energy. Thus, the free layer 130 may have its magnetic moment oriented perpendicular-to-plane as shown. Because this magnetic moment is switchable, it is depicted as a dual headed arrow in FIG. 2. In other embodiments, other directions are possible for the magnetic moment of the free layer 130. For example, the free layer 130 may have its magnetic moment stable in-plane or at an angle from the z-direction.

The free layer 130 is thermally stable when the magnetic junction 100 is not being written (quiescent/in standby mode). The free layer 130 is also characterized by a magnetic thermal stability coefficient, Δ. In some embodiments, therefore, the magnetic thermal stability coefficient, Δ, of the free layer 130 is at least sixty at non-programming operating temperatures, or standby temperatures. In some such embodiments, the magnetic thermal stability coefficient is at least eighty up to a preselected standby temperature. This standby temperature is above room temperature. In some embodiments, this standby temperature is at least eighty-five degrees Celsius. During writing, however, the free layer 130 is heated. This heating may be accomplished using only the write current driven through the magnetic junction 100 or by using the write current in combination with another heat source. The magnetic thermal stability coefficient, Δ, of the free layer 130 decreases with increasing temperature. Thus, the magnetic thermal stability coefficient of the free layer 130 is below eighty during writing. In some embodiments, the magnetic thermal stability coefficient of the free layer 130 is desired to be not more than forty during writing. Thus, the free layer 130 may be written at temperatures on the order of one-hundred fifty degrees Celsius or higher. However, the magnetic thermal stability coefficient of the free layer 130 is also desired to be above zero during writing. In some embodiments, the magnetic thermal stability coefficient is desired to be at least twenty at temperature achieved during writing. In some embodiments, the magnetic thermal stability coefficient is at least twenty and not more than twenty-five during at least a portion of the write operation. Thus, in some embodiments, the free layer temperature does not exceed two hundred and forty degrees Celsius during writing. However, other standby temperatures, minimum write temperatures and maximum write temperatures may be employed.

The free layer 130 also has a multi-phase magnetic thermal stability coefficient, $\Delta = K_u * V/k_B T$, where $K_u V$ is an expression for the (temperature dependent) energy barrier for switching of the magnetic moment, $k_b$ is the Boltzman constant and T is temperature in Kelvin. As used herein a multi-phase magnetic thermal stability coefficient has multiple phases for which the magnetic thermal stability coefficient is greater than zero. The magnetic thermal stability coefficient may also be zero above a particular critical temperature. However, this portion of the magnetic thermal stability coefficient is not considered to be part of the multi-phase behavior. Different phases are separated by phase transition(s). The slopes of the phases of the magnetic thermal coefficient differ at the temperature corresponding to the phase transition. If the magnetic thermal stability coefficient has a first phase below a first temperature and a second phase above the first (phase transition) temperature, the first temperature is a phase transition temperature. The slopes of the first and second phases are not equal at the first temperature (the phase transition temperature). In other words, the (first) slope of the magnetic thermal stability coefficient (for the first phase) just below the first temperature is different from the (second) slope of the magnetic thermal stability coefficient (for the second phase) just above the first temperature. The slope of the magnetic thermal stability coefficient may thus be considered to be discontinuous at this temperature. Stated differently, the magnetic thermal stability coefficient has a sharp transition between the first and second phases. The magnetic thermal stability coefficient may include more than two phases. For example, the magnetic thermal stability coefficient might include three or more phases. Different phases are separated by phase transitions analogous to that described above and have magnitudes greater than zero. In addition to having multiple phases, the slopes (magnitude of Δ versus temperature) of a first phase and a second phase differ. At least a portion of the slope of the first phase is more negative than at least a portion of the slope of the second phase. The slope of the first phase generally has a larger magnitude than the slope of the second phase. In some embodiments, this means that the total change in the magnetic thermal stability constant for the first phase from room temperature to the phase transition temperature divided by the change in temperature (total change in Δ for phase 1/(phase transition temperature–room temperature)) is greater than the total change in the magnetic thermal stability constant for the second phase from the first phase transition temperature to the second phase transition temperature or critical temperature divided by the change in temperature for the over the second phase (total change in Δ for phase 2/(phase transition temperature or critical temperature–room temperature)). In other words, the magnetic thermal stability coefficient changes more rapidly for the first phase than for the second phase.

Figure 3A:
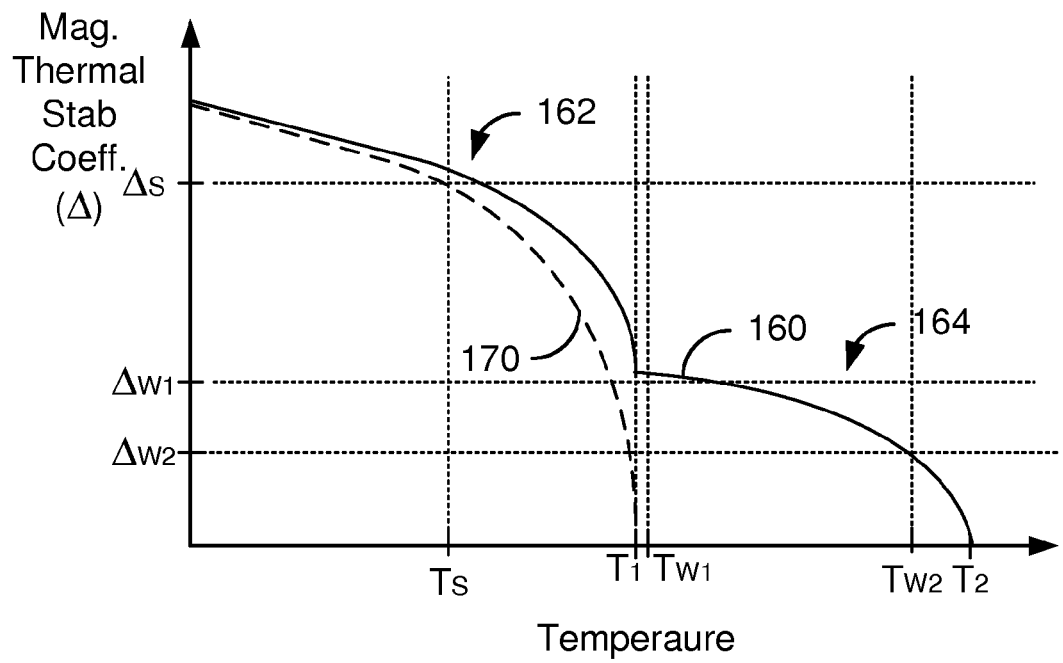
FIGS. 3A and 3B are graphs depicting embodiments of magnetic thermal stability coefficient versus temperature and versus time for a write operation.
Figure 3B:
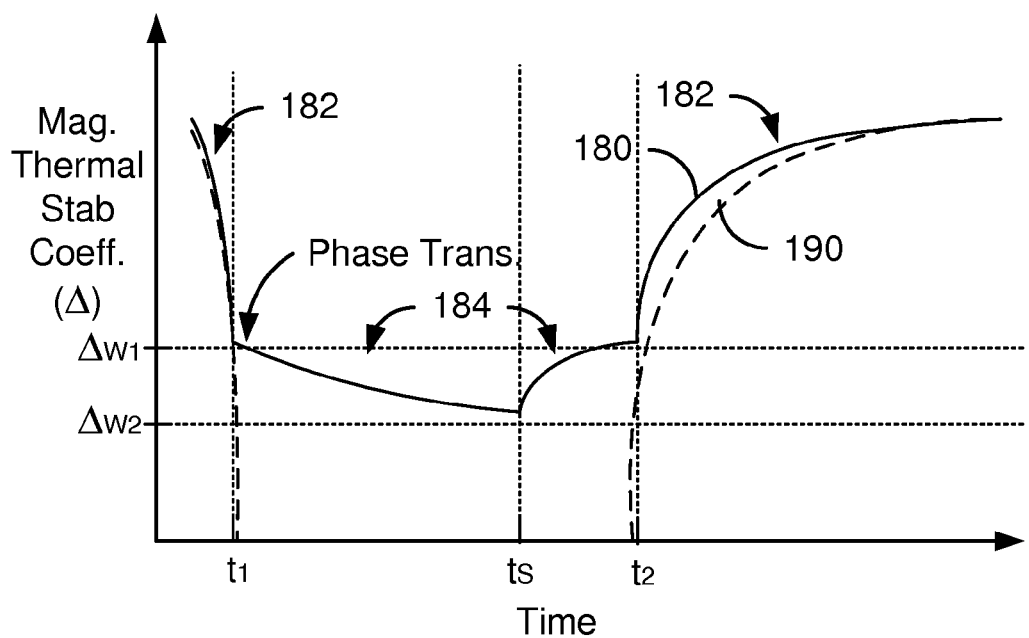

For example, FIGS. 3A and 3B are graphs depicting the magnetic thermal stability coefficient behavior for the free layer 130. Referring to FIGS. 2-3B, although particular slopes and shapes are shown in FIGS. 3A-3B, these are explanatory purposes only and are not meant to represent specific numerical values except where noted. FIG. 3A includes a curve 160 depicting the magnetic thermal stability coefficient versus temperature of the free layer 130. For comparison, a dashed curve 170 depicting a conventional magnetic thermal stability coefficient is also shown. As can be seen in FIG. 3A, the conventional magnetic thermal stability coefficient 170 smoothly goes to zero, with an increasingly negative slope. At temperature $T_1$, the conventional magnetic thermal stability coefficient 170 goes to zero and remains zero above $T_1$. Thus, the conventional magnetic thermal stability coefficient 170 has a single phase below the critical temperature, $T_1$.

In contrast, the magnetic thermal stability coefficient 160 includes two phases 162 and 164. The magnetic thermal stability coefficient 160 goes to zero at $T_2$ and may remain zero above $T_2$. Thus, $T_2$ may be considered the critical temperature for the magnetic thermal stability coefficient 160. The magnetic thermal stability coefficient 160 is greater than zero below $T_2$ and has a phase transition at $T_1$. The first phase 162 is for temperatures below $T_1$, while the second phase 164 is for temperatures between $T_1$ and $T_2$. At the transition between the phases 162 and 164, the slope of the magnetic thermal stability coefficient 160 is discontinuous. The slope of the first phase 162 and the slope of the second phase 164 differ at the transition temperature $T_1$. Stated differently, the slope of the magnetic thermal stability coefficient 160 for the first phase 162 just below the temperature $T_1$ is different from the slope of the magnetic thermal stability coefficient 160 for the second phase 164 just above the temperature $T_1$. In other words, the magnetic thermal stability coefficient 160 has a sharp (phase) transition at $T_1$. Below $T_1$, the first phase 162 of the magnetic thermal stability coefficient 160 may change more rapidly. Above $T_1$, the second phase 164 of the magnetic thermal stability coefficient 160 may change more slowly. Thus, the slope of the first phase 162 is generally more negative than the slope of the second phase 164. In some embodiments, this corresponds to: $|\Delta_{T1} - \Delta_0|/(T_1 - T_0) > |\Delta_{T2} - \Delta_{T1}|/(T_2 - T_1)$. Because the second phase 164 of the magnetic thermal stability coefficient 160 changes more slowly than the first phase, the difference between $T_1$ and $T_2$ may be significant. In some embodiments, $T_2$ is at least one hundred degrees Celsius higher than $T_1$. For example, $T_1$ may be approximately one hundred fifty degrees Celsius and not more than two hundred degrees Celsius. In such an embodiment, $T_2$ may be two hundred fifty degrees Celsius or greater. In some such embodiments, T2 may be as high as eight hundred degrees Celsius.

As can be seen in FIG. 3A, the magnetic thermal stability coefficients 160 and 170 are both above a minimum desired thermal stability coefficient for standby, $\Delta_s$, as long as the temperature does not exceed $T_s$. $T_s$ is the maximum temperature at which the free layer 130 is expected to be in standby (quiescent). In some embodiments, $T_s$ is not more than eighty-five degrees Celsius. The minimum desired magnetic thermal stability coefficient or standby ($\Delta_s$) is described above and may be eighty in some embodiments. Thus, the free layer 130 is sufficiently stable for the magnetic junction 100 to be used in STT-MRAM.

The magnetic junction 100 is heated during writing. The desired temperatures and range for the magnetic thermal stability coefficient 160 for programming are also indicated in FIG. 3A. Programming may be achieved at temperatures of at least $T_{w1}$ and not more than $T_{w2}$. In the embodiment shown, $T_{w1}$ and $T_1$ are different. In other embodiments, $T_1$ and $T_{w1}$ may be the same. These temperatures correspond to a desired range for the magnetic thermal stability coefficient 160 of at least twenty and, in some embodiments, not more than forty. In some such embodiments, the magnetic thermal stability coefficient is not more than twenty-five for temperatures not less than $T_{w1}$ and not more than $T_{w2}$. In some embodiments, this range is approximately ninety degrees Celsius. For example, $T_{w1}$ may be at least one hundred and fifty degrees Celsius, while $T_{w2}$ may be not more than two hundred forty degrees Celsius. This range arises from the undefined standby temperature of the device. Thus, if the device is cooler, for example at 0 C during the start of the writing cycle, it may heat up to 150 C, whereas if the starting temperature is 80 C, it will heat up to 230 C or so. However, other temperature ranges are possible. In general the desired temperature range for writing corresponds to a reduced magnetic thermal stability coefficient 160, which translates to a lower write current. Further, in the desired temperature range for writing, the magnetic thermal stability coefficient is greater than zero. As discussed below, this may translate to reduced write errors.

For a read operation, a read current may be driven through the magnetic junction 100 and the state determined based on magnetoresistance. The minimum magnetic thermal stability coefficient for standby ($\Delta_s$) is selected such that the free layer 130, and thus the magnetic junction 100, remain stable during a write operation. This may correspond to the temperature of the free layer 130 not exceeding $T_s$ during reading. Thus, a read operation generally does not change the state of the magnetic junction 100.

In a write operation, a write current is driven through the magnetic junction 100 in the current perpendicular-to-plane (CPP) configuration to program the magnetic junction 100. In FIG. 2, the write current is driven between the contacts 101 and 103, substantially in the z-direction. The write current alone or in addition to heat from another source heats the free layer 130. In some embodiments, an additional line or heater (not shown in FIG. 2) is used to heat the magnetic junction 100 being programmed. The magnetic junction 100 is programmed using at least thermally assisted spin transfer. Other mechanisms, such as an external magnetic field and/or a spin orbit coupling, might also be employed.

FIG. 3B includes a curve 180 depicting the magnetic thermal stability coefficient for the magnetic junction 100 versus time during a write operation. For comparison, the dashed line 190 indicates the behavior off a conventional magnetic junction during a thermally assisted write operation. The write current pulse or other heating mechanism is assumed to be switched off at time $t_s$. For a conventional magnetic junction, the free layer is heated above the critical temperature, resulting in the conventional magnetic thermal stability coefficient 190 reaching zero. Spin transfer is used to switch the magnetic moment of the conventional free layer and the heat turned off. For some time after $t_s$, the conventional magnetic thermal stability coefficient 190 remains zero. Only when enough time has passed for the conventional free layer to have sufficiently cooled does the magnetic thermal stability coefficient 190 increase. At times when the conventional magnetic thermal stability coefficient 190 is low, the conventional free layer magnetic moment is unstable and may switch, resulting in a write error.

In contrast, the curve 180 indicates the magnetic thermal stability coefficient of the free layer 130 during writing. As heat is applied, either externally or via a write current, the magnetic thermal stability coefficient 180 decreases and passes from the first phase 182 to the second phase 184. The free layer 130 reaches the transition temperature, $T_1$, at time $t_1$. The magnetic thermal stability coefficient 180 remains in the second phase 184 and continues to decrease at a smaller rate as time passes and the free layer 130 continues increase in temperature. At time $t_s$, the write current or heater power is turned off. The free layer 130 has been written by time $t_s$. In other embodiments, heating may be terminated at a different time than the write current. However, these times are generally desired to be very close, for example within a few hundred nanoseconds. During writing, between times $t_1$ and $t_s$, the magnetic thermal stability coefficient is at least $\Delta_{w2}$ and not more than $\Delta_{w1}$. $\Delta_{w2}$ is greater than zero. In some embodiments, $\Delta_{w2}$ is at least twenty and $\Delta_{w1}$ is not more than forty. In some such embodiments, $\Delta_{w2}$ is at least twenty and $\Delta_{w1}$ is not more than twenty-five. After time $t_s$, the free layer 130 begins to cool. At time $t_3$, the free layer 130 has cooled sufficiently to transition back to the first phase 182. As can be seen in FIGS. 3A and 3B, the first phase 162/182 of the magnetic thermal stability coefficient 160/180 changes more rapidly with temperature, and thus time, than the second phase 164/184. Because the magnetic thermal stability coefficient 160/180 is greater than zero during the write operation and remains above zero, the free layer magnetic moment is more likely to remain stable after being written.

The multi-phase nature of the magnetic thermal stability coefficient of the free layer 130 may be achieved by configuring the free layer 130. For example, the perpendicular magnetic anisotropy of the free layer 130 may be engineered to have multiple dependencies. For example, the free layer 130 may be a multilayer. One subset of sublayer(s) in the multilayer may have a perpendicular anisotropy that is insensitive or substantially less sensitive to temperature. For example, one or more of the sublayers may have a perpendicular anisotropy that arises primarily from a bulk interaction, such as crystalline structure or internal strain. This subset has a perpendicular anisotropy that is generally relatively insensitive to temperature and may correspond to at least the second phase of the magnetic thermal stability coefficient. Another subset of sublayer(s) may have a perpendicular anisotropy that is due primarily to an interface-induced anisotropy. Such a magnetic anisotropy is generally more sensitive to temperature. Consequently, the magnetic thermal stability coefficient may also be more sensitive to temperature. This subset of sublayer(s) form at least the first phase of the magnetic thermal stability coefficient. Other subset(s) of sublayer(s) may correspond to other phase(s) of the magnetic thermal stability coefficient for the free layer 130 having different temperature sensitivities. For example, the free layer 130 may include a first layer having an interface induced perpendicular anisotropy and a second layer having a bulk perpendicular magnetic anisotropy. These layers may be magnetically coupled through a coupling layer. Such a free layer 130 has at least two phases for the magnetic thermal stability coefficient 160/180 as discussed above. In another embodiment, the free layer 130 may include multiple sublattices. One sublattice may correspond to the second phase and a magnetic thermal stability coefficient that is less sensitive to temperature. This sublattice may also have a bulk anisotropy that gives rise to the magnetic thermal stability coefficient. Another sublattice may correspond to the first phase and a magnetic thermal stability coefficient that is more sensitive to temperature. This sublattice may have an interfacial perpendicular anisotropy. Additional sublattice(s) may correspond to other phases having different temperature sensitivities of the magnetic thermal stability coefficient to temperature. For example, the free layer 130 may include an alloy having a first sublattice having a perpendicular magnetic anisotropy with a strong temperature dependence and a second sublattice having a perpendicular magnetic anisotropy with a weaker temperature dependence. Such a free layer 130 has at least two phases for the magnetic thermal stability coefficient.

The magnetic junction 100 and free layer 130 may have improved performance. The free layer 130 may be switched using spin transfer torque. Thus, a more localized physical phenomenon may be used to write to the free layer 130. The thermal properties of the free layer 130 and magnetic junction 100 may also be configured. In particular, the magnetic moment of the free layer 130 may be more easily and reliably switched. Because higher temperature switching may be used, the write current may be reduced and/or switching may be performed more rapidly. This switching may occur at a magnetic thermal stability coefficient that is greater than zero at least in part because of the multi-phase nature of the magnetic thermal stability constant. As a result, the free layer magnetic moment is more stable after switching, during cooling of the free layer 130. Consequently, reliability of programming the free layer 130 may be enhanced. Thus, the magnetic junction 100 may have improved performance.

Figure 4:
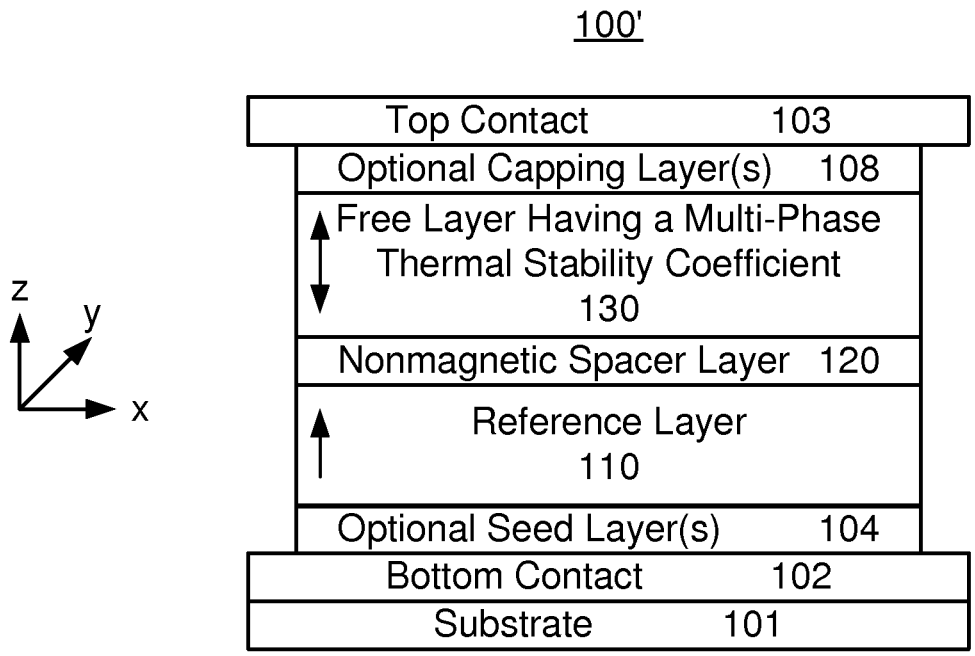
FIG. 4 depicts another exemplary embodiment of a magnetic junction usable in a magnetic memory programmable using spin transfer torque and which includes a free layer having a multi-phase thermal stability coefficient.

FIG. 4 depicts another exemplary embodiment of a magnetic junction 100' usable in a magnetic device as well as surrounding structures. For clarity, FIG. 4 is not to scale. The magnetic junction 100' may be used in a magnetic device such as a STT-MRAM and, therefore, in a variety of electronic devices. The magnetic junction 100' is analogous to the magnetic junction 100. Consequently, analogous components are labeled similarly. Thus, the magnetic junction 100' includes a reference layer 110, a nonmagnetic spacer layer 120, and a free layer 130 that are analogous to the layers 110, 120 and 130, respectively, for the magnetic junction 100. Also shown are an underlying substrate 101, optional seed layer 104, optional pinning layer 106, and optional capping layer 108 that are analogous to those depicted with the magnetic junction 100. The layers 140, 150 and 109 have been omitted. In addition, the pinning layer 106 is omitted. In the embodiment shown in FIG. 4, therefore, the magnetic junction 100' is a single magnetic junction including only one nonmagnetic spacer layer 120. Although the free layer 130 is further from the substrate 101 than the reference layer 110 in the magnetic junction 100', in other embodiments, the order of the layers 110, 120 and 130 may be reversed. Alternatively, the single magnetic junction 100 could include layers 130, 140 and 150.

The free layer 130 has multi-phase magnetic thermal stability constant analogous to that of the free layer 130 depicted in FIG. 2 and described above. In some embodiments, the magnetic thermal stability constant of the free layer 130 of FIG. 4, may be analogous to the magnetic thermal stability constant 160/180 depicted in FIGS. 3A and 3B.

The free layer 130 is programmed and read in an analogous manner to the free layer 130 described above. Thus, the magnetic junction 100' may remain stable during reading and may share the benefits of the magnetic junction 100. The free layer 130 may be switched using spin transfer torque. Thus, a more localized physical phenomenon may be used to write to the free layer 130. In particular, the magnetic moment of the free layer 130 may be more easily and reliably switched using thermal assistance. Because higher temperature switching may be used, the write current may be reduced and/or switching may be performed more rapidly. As described above, this switching may occur at a magnetic thermal stability coefficient that is greater than zero at least in part because of the multi-phase nature of the magnetic thermal stability constant. The free layer magnetic moment is more stable after switching, during cooling of the free layer 130. Consequently, reliability of programming the free layer 130 may be enhanced. Thus, the magnetic junction 100' may have improved performance.

Figure 5:
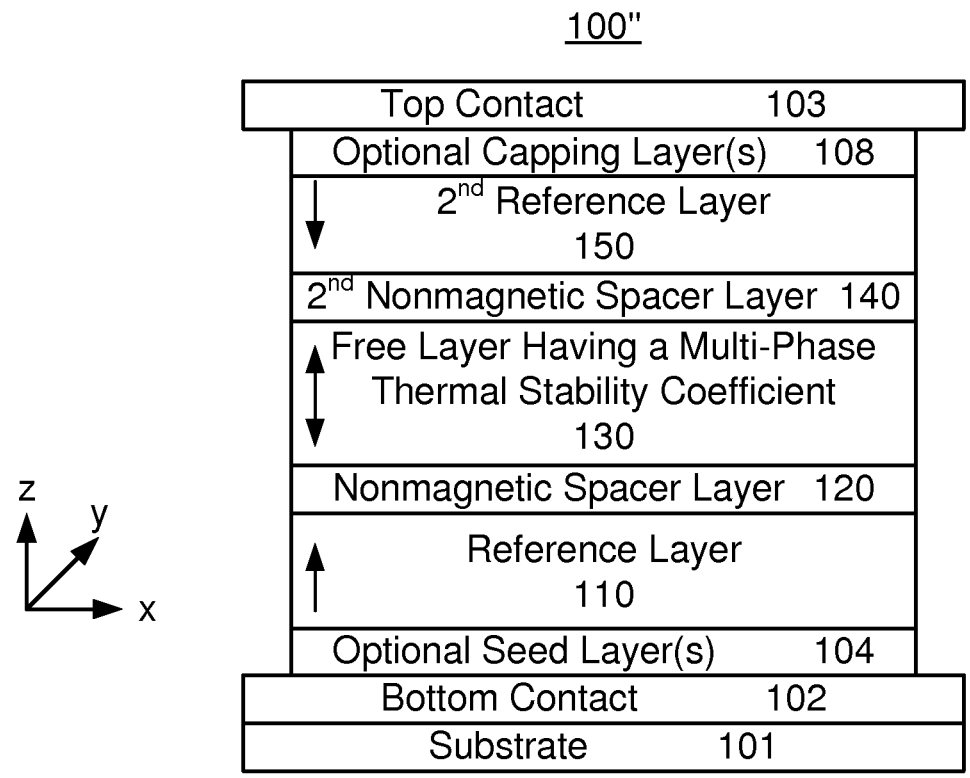
FIG. 5 depicts another exemplary embodiment of a magnetic junction usable in a magnetic memory programmable using spin transfer torque and which includes a free layer having a multi-phase thermal stability coefficient.

FIG. 5 depicts another exemplary embodiment of a magnetic junction 100" usable in a magnetic device as well as surrounding structures. For clarity, FIG. 5 is not to scale. The magnetic junction 100" may be used in a magnetic device such as a STT-MRAM and, therefore, in a variety of electronic devices. The magnetic junction 100" is analogous to the magnetic junctions 100 and 100'. Consequently, analogous components are labeled similarly. Thus, the magnetic junction 100" includes a reference layer 110, a nonmagnetic spacer layer 120, a free layer 130, an additional nonmagnetic spacer 140 and a reference layer 150 that are analogous to the layers 110, 120, 130, 140 and 150 respectively, for the magnetic junctions 100 and 100'. Also shown are an underlying substrate 101, optional seed layer 104, optional pinning layer 106, and optional capping layer 108 that are analogous to those depicted with the magnetic junction 100. The pinning layers 106 and 109 are omitted. In the embodiment shown in FIG. 5, therefore, the magnetic junction 100" is a dual magnetic junction. The magnetic moments of the reference layers 110 and 150 are shown in the dual (antiparallel) state. This state may be desired for writing. In other embodiments, the magnetic moments of the reference layer 110 and 150 may be parallel (antidual state), which may be more desirable for read operations. In other embodiments, the magnetic moments of the layers 110 and 150 may be switched between the dual and antidual states depending upon the operation to be performed.

The free layer 130 has multi-phase magnetic thermal stability constant analogous to that of the free layer 130 depicted in FIG. 2 and described above. In some embodiments, the magnetic thermal stability constant of the free layer 130 of FIG. 5, may be analogous to the magnetic thermal stability constant 160/180 depicted in FIGS. 3A and 3B.

The free layer 130 of the magnetic junction 100" is programmed and read in an analogous manner to the free layer 130 described above. Thus, the magnetic junction 100" may remain stable during reading and may share the benefits of the magnetic junction 100 and 100'. The free layer 130 may be switched using thermally assisted spin transfer torque. Thus, a more localized physical phenomenon may be used to write to the free layer 130. Because higher temperature switching may be used, the write current may be reduced and/or switching may be performed more rapidly. As described above, this switching may occur at a magnetic thermal stability coefficient that is greater than zero at least in part because of the multi-phase nature of the magnetic thermal stability constant. The free layer magnetic moment is more stable after switching, during cooling of the free layer 130. Consequently, reliability of programming the free layer 130 may be enhanced. Further, programming and/or reading may be enhanced by the presence of multiple reference layers 110 and 150. Thus, the magnetic junction 100" may have improved performance.

Figure 6:
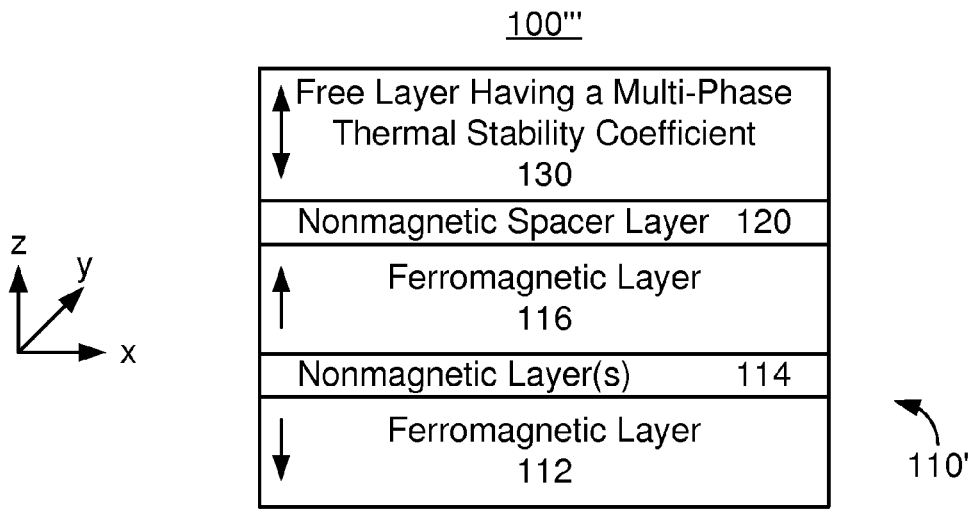
FIG. 6 depicts another exemplary embodiment of a magnetic junction usable in a magnetic memory programmable using spin transfer torque and which includes a free layer having a multi-phase thermal stability coefficient.

FIG. 6 depicts another exemplary embodiment of a magnetic junction 100''' usable in a magnetic device as well as surrounding structures. For clarity, FIG. 6 is not to scale. The magnetic junction 100''' may be used in a magnetic device such as a STT-MRAM and, therefore, in a variety of electronic devices. The magnetic junction 100''' is analogous to the magnetic junctions 100, 100' and 100". Consequently, analogous components are labeled similarly. Thus, the magnetic junction 100''' includes a reference layer 110', a nonmagnetic spacer layer 120, and a free layer 130 that are analogous to the layers 110, 120 and 130, respectively, for the magnetic junctions 100, 100' and 100". Other layers are not shown and/or have been omitted. For example, the layers 106, 140, 150 and 109 have been omitted. In the embodiment shown in FIG. 6, therefore, the magnetic junction 100'' is a single magnetic junction including only one nonmagnetic spacer layer 120. The free layer 130 shown on top of the reference layer 110'. In other embodiments, the order of the layers 110', 120 and 130 may be reversed.

The free layer 130 has multi-phase magnetic thermal stability constant analogous to that of the free layer 130 depicted in FIG. 2 and described above. In some embodiments, the magnetic thermal stability constant of the free layer 130 of FIG. 6, may be analogous to the magnetic thermal stability constant 160/180 depicted in FIGS. 3A and 3B.

The reference layer 110' is a multilayer including ferromagnetic layers 112 and 116 separated by a nonmagnetic spacer layer 114. In other embodiments, other multilayer(s) may be used for the reference layer 110'. Further, each layer 112, 114, and 116 may include sublayers. In the embodiment shown, the reference layer 110' is a SAF in which the magnetic moments of the ferromagnetic layers 112 and 116 are coupled antiparallel. In other embodiments, the magnetic moments of the layers 112 and 116 may be coupled in another manner.

The free layer 130 is programmed and read in an analogous manner to the free layer 130 described above. Thus, the magnetic junction 100''' may remain stable during reading and may share the benefits of the magnetic junctions 100, 100' and 100''. The free layer 130 may be switched using thermally assisted spin transfer torque. Thus, a more localized physical phenomenon may be used to write to the free layer 130. Because higher temperature switching may be used, the write current may be reduced and/or switching may be performed more rapidly. As described above, this switching may occur at a magnetic thermal stability coefficient that is greater than zero in part because of the multi-phase nature of the magnetic thermal stability constant. The free layer magnetic moment is more stable after switching, during cooling of the free layer 130. Consequently, reliability of programming the free layer 130 may be enhanced. Thus, the magnetic junction 100''' may have improved performance.

Figure 7:
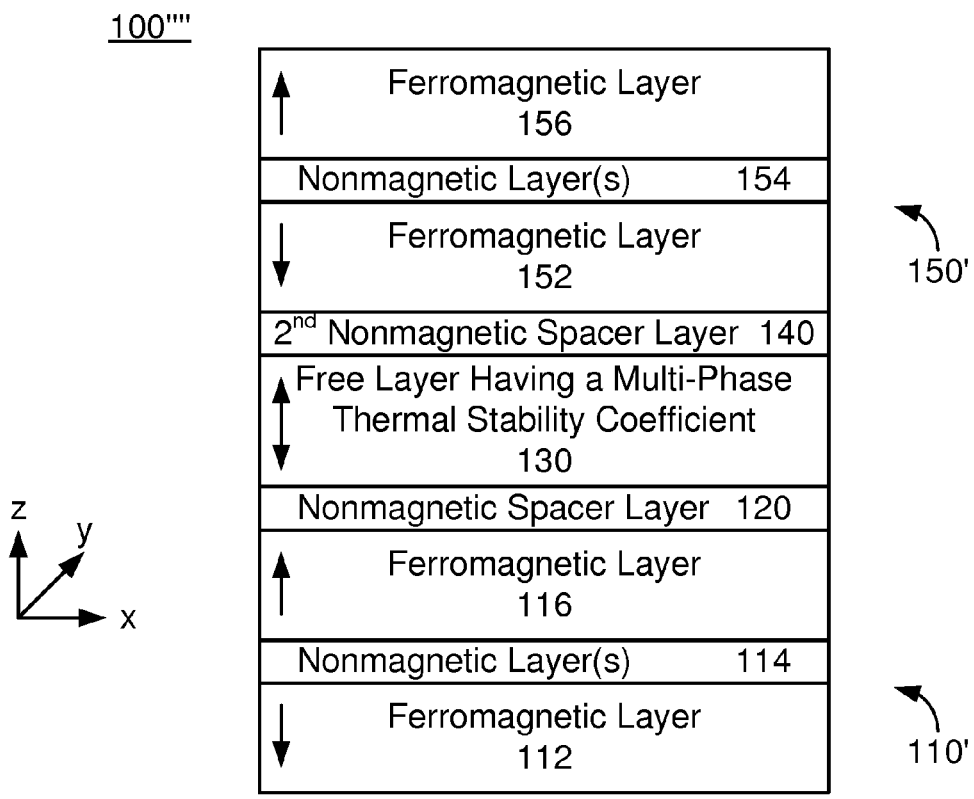
FIG. 7 depicts another exemplary embodiment of a magnetic junction usable in a magnetic memory programmable using spin transfer torque and which includes a free layer having a multi-phase thermal stability coefficient.

FIG. 7 depicts another exemplary embodiment of a magnetic junction 100'''' usable in a magnetic device as well as surrounding structures. For clarity, FIG. 7 is not to scale. The magnetic junction 100'''' may be used in a magnetic device such as a STT-MRAM and, therefore, in a variety of electronic devices. The magnetic junction 100'''' is analogous to the magnetic junctions 100, 100', 100" and 100'''. Consequently, analogous components are labeled similarly. Thus, the magnetic junction 100'''' includes a reference layer 110', a nonmagnetic spacer layer 120, a free layer 130, an additional nonmagnetic spacer 140 and a reference layer 150' that are analogous to the layers 110/110', 120, 130, 140 and 150 respectively, for the magnetic junctions 100, 100', 100" and 100'''. The pinning layers 106 and 109 are omitted. In the embodiment shown in FIG. 7, therefore, the magnetic junction 100'''' is a dual magnetic junction. The magnetic moments of the reference layers 110' and 150' are shown in the dual (antiparallel) state. This state may be desired for writing. In other embodiments, the magnetic moments of the reference layer 110' and 150' may be parallel (antidual state), which may be more desirable for read operations. In other embodiments, the magnetic moments of the layers 110' and 150' may be switched between the dual and antidual states depending upon the operation to be performed.

The reference layer 110' is shown as including ferromagnetic layers 112 and 116 separated by nonmagnetic spacer layer 114. The reference layer 110' of FIG. 7 is thus analogous to the reference layer 110' depicted in FIG. 6. The reference layer 150' is a multilayer including ferromagnetic layers 152 and 156 separated by a nonmagnetic spacer layer 154. In other embodiments, other multilayer(s) may be used for the reference layer 150'. Further, each layer 152, 154, and 156 may include sublayers. In the embodiment shown, the reference layer 150' is a SAF in which the magnetic moments of the ferromagnetic layers 152 and 156 are coupled antiparallel. In other embodiments, the magnetic moments of the layers 152 and 156 may be coupled in another manner. Although both reference layers 110' and 150' are shown as multilayers, in other embodiments, one or both of the layers 110' and 150' may have a different structure.

The free layer 130 has multi-phase magnetic thermal stability constant analogous to that of the free layer 130 depicted in FIG. 2 and described above. In some embodiments, the magnetic thermal stability constant of the free layer 130 of FIG. 7, may be analogous to the magnetic thermal stability constant 160/180 depicted in FIGS. 3A and 3B.

The free layer 130 of the magnetic junction 100'''' is programmed and read in an analogous manner to the free layer 130 described above. Thus, the magnetic junction 100'''' may remain stable during reading and may share the benefits of the magnetic junction 100, 100', 1000" and 100'''. The free layer 130 may be switched using thermally assisted spin transfer torque. Thus, a more localized physical phenomenon may be used to write to the free layer 130. Because higher temperature switching may be used, the write current may be reduced and/or switching may be performed more rapidly. As described above, this switching may occur at a magnetic thermal stability coefficient that is greater than zero at least in part because of the multi-phase nature of the magnetic thermal stability constant. The free layer magnetic moment is more stable after switching, during cooling of the free layer 130. Consequently, reliability of programming the free layer 130 may be enhanced. Further, programming and/or reading may be enhanced by the presence of multiple reference layers 110' and 150'. Thus, the magnetic junction 100''' may have improved performance.

Figure 8:
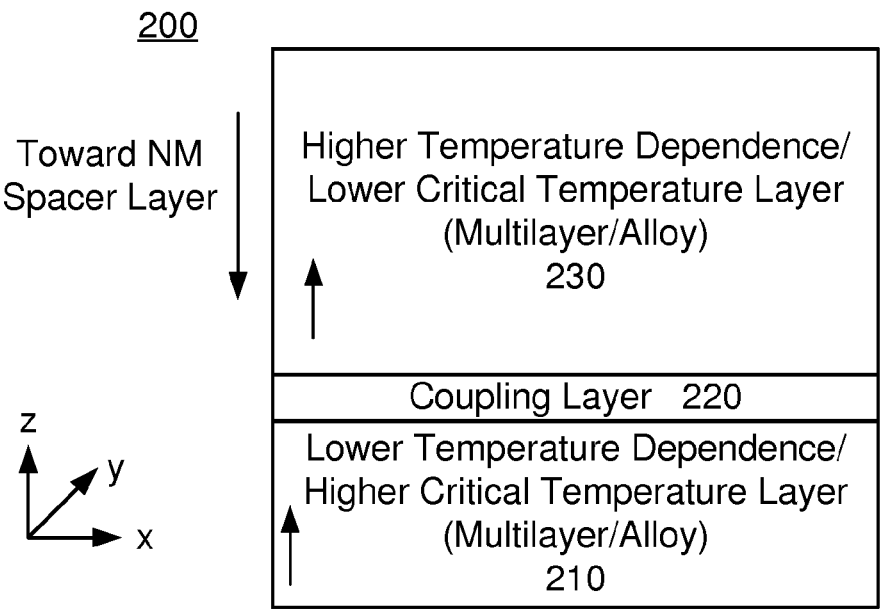
FIG. 8 depicts an exemplary embodiment of a free layer having a multi-phase thermal stability coefficient and which may be programmed using spin transfer torque.
Figure 9:
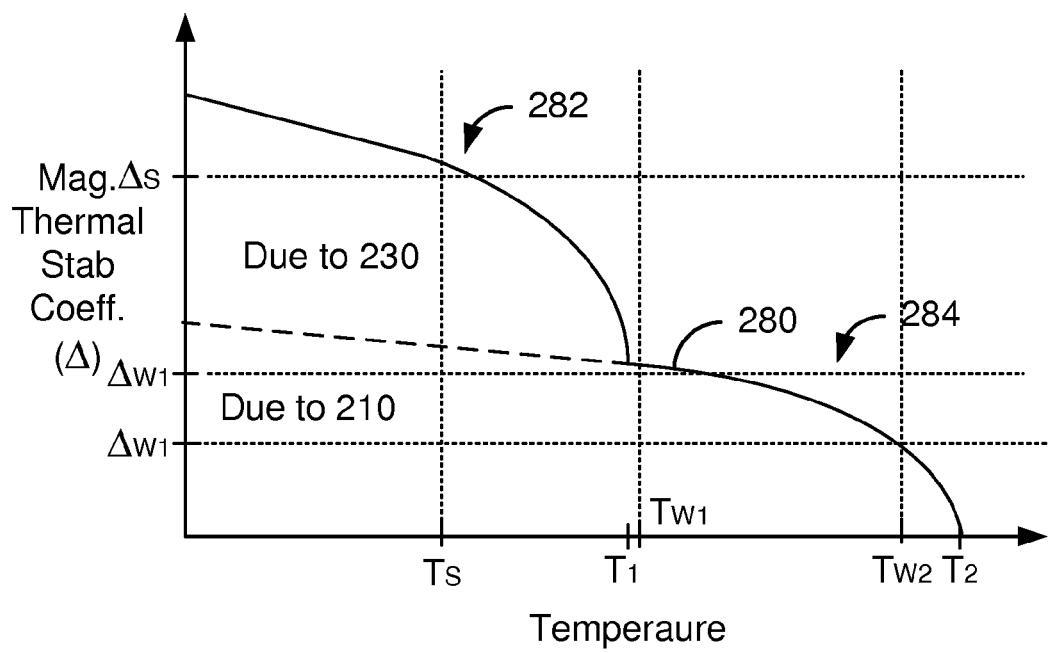
FIG. 9 is a graph depicting an exemplary embodiment of the magnetic thermal stability versus temperature constant for a free layer having a multi-phase magnetic thermal stability coefficient.

FIG. 8 depicts an exemplary embodiment of a free layer 200 usable in a magnetic junction such as the magnetic junction 100, 100', 100", 100''' and/or 100''''. For clarity, FIG. 8 is not to scale. FIG. 9 is a graph depicting an exemplary embodiments of magnetic thermal stability coefficient versus temperature for the free layer 200. The free layer 200 is configured to be switched between stable magnetic states when a write current is passed through the magnetic junction 100, 100', 100", 100''' and/or 100''''. Thus, the free layer 200 is switchable utilizing spin transfer torque. The free layer 200 is also switched at an elevated temperature. Thus, thermally assisted spin transfer torque switching may be considered to be used.

The free layer 200 includes a lower temperature dependence layer 210, a coupling layer 220 and a higher temperature dependence layer 230. Each of the layers 210, 220 and 230 may be a multilayer and/or an alloy. Note that although described as separate layers, in other embodiments, the layers 210 and 230 may be considered two sublattices of a free layer 200 in which the coupling layer 220 is omitted. The layers 210 and 230 are magnetic. In the embodiment shown, the layers 210 and 230 have perpendicular magnetic anisotropy energies of that exceed the out-of-plane demagnetization energies. Thus, the magnetic moments of the layers 210 and 230 may be out of plane (e.g. perpendicular-to-plane as shown in FIG. 8). The magnetic layer 210 is closer to the nonmagnetic layer, such as the layer 120, than the magnetic layer 230. Thus, in embodiments in which the nonmagnetic layer is above the free layer 200, the magnetic layer 210 is on the magnetic layer 230. The coupling layer 220 may still be between the layers 210 and 230. Further, although only one magnetic layer 210, one coupling layer 220 and one magnetic layer 230 are shown, in another embodiment, more layers may be used. For example, an additional coupling layer and an additional lower temperature dependence layer may be included on the layer 230.

The magnetic layer 210 has a lower temperature dependence. For example, the perpendicular anisotropy of the layer 210 may be primarily or completely due to a bulk perpendicular anisotropy of the material(s) used. As a result, the perpendicular anisotropy and, therefore, the magnetic thermal stability coefficient of the magnetic layer 210 may vary less with temperature. The magnetic layer 230 has a higher temperature dependence. For example, the perpendicular anisotropy of the layer 230 may be primarily or totally due to an interfacial perpendicular anisotropy of the material(s) used. Thus, the interfaces of between the magnetic layer 230 and other layers, such as the coupling layer 220, may result in a significant portion (or all) of the perpendicular anisotropy. The perpendicular anisotropy and, therefore, the magnetic thermal stability coefficient of the magnetic layer 230 may vary more with temperature.

The magnetic layer 210 having a lower temperature dependence for the magnetic thermal stability coefficient may be configured in a variety of ways. For example, the magnetic layer 210 may include a $Co_aFe_bB_c/W/Fe/W/Co_dFe_eB_f$ multilayer. In such an embodiment, a+b+c=1, d+e+f=1, at least one of a and b is nonzero and at least one of d and e is nonzero. In some embodiments, additional repeats of CoFeB layers interleaved with and sandwiching W/Fe/W trilayers may be used. Similarly, at least one of d and e is nonzero. As a result, the layer 210 is magnetic. In other embodiments, the magnetic layer 210 may include a $Fe/Co_hFe_iB_j/W/Fe/W/Co_kFe_mB_n$ multilayer. In such an embodiment, h+i+j=1 and k+m+n=1. Further, at least one of h and i and at least one of k and m are nonzero. In the above multilayers, the CoFeB layers may have concentrations as follows: Co: 1-30 atomic percent, Fe: 40-99 atomic percent and B: 1-50 atomic percent. In some such embodiments, the CoFeB layers may have concentrations as follows: Co 10-20 atomic percent, Fe: 60-90 atomic percent and B 10-30 atomic percent. In the above multilayers in which the B concentration is zero, the CoFe layers may have concentrations as follows: Co: 1-70 atomic percent and Fe 30-99 atomic percent. In some such embodiments, the CoFe layers may have concentrations as follows: Co: 10-30 atomic percent and Fe 70-90 atomic percent. Thus, the layer 210 is magnetic. Further, additional repeats of multilayers interleaved with and sandwiching W/Fe/W trilayers may be employed. The magnetic layer 210 may also include a $Co_oFe_p/Co_qFe_rB_s/W/Fe/W/Co_tFe_uB_v$ multilayer, where o+p=1, q+r+s=1, and t+u+v=1. At least one of q and r and at least one of t and u are nonzero. Again, additional repeats of the magnetic layers separated by the W/Fe/W trilayer may also be used. Some combination of the above multilayers may also be used. In some embodiments, the magnetic layer 210 is at least five and not more than twenty Angstroms thick.

The magnetic layer 230 having a higher temperature dependence for the magnetic thermal stability coefficient may be configured in a variety of ways. The magnetic layer 230 may include a $[Co_aT_b/Pd]_i$ bilayer, where a+b=1, a is greater than zero and i is at least one (at least one repeat) and T is a nonmagnetic metal. Similarly, a $Co_aT_bPd$, alloy in which a+b+c=1, a is greater than zero and T is a nonmagnetic metal may be used. A $[Fe_cX_d/Pd]_j$ bilayer in which c+d=1, j is at least one, c is greater than zero and X is a nonmagnetic metal may be used. The magnetic layer 230 may include $Fe_cX_dPd_e$ alloy layer(s) in which c+d+e=1, c is greater than zero an X is a nonmagnetic metal. The magnetic layer 230 may include a $[Co_eX_f/Pt]_k$ bilayer in which e+f=1, e is greater than zero, k is at least one and X is a nonmagnetic metal. $Co_eX_fPt_j$ alloy layer(s) in which e+f+j=1, e is greater than zero and X is a nonmagnetic metal may be used. The magnetic layer 230 may include $[Fe_gZ_h/Pt]_m$ bilayer in which g+h=1, g is greater than zero, m is at least one and Z is a nonmagnetic metal. $Fe_gZ_hPt$, alloy layer(s) in which g+h=1, g is greater than zero and Z is a nonmagnetic metal may be used. The magnetic layer 230 may include one or more of a $[Co/Ni]_n$ bilayer where n is at least one, MnAl, MnGa, MnIn, MnGe, and $RE_oQ_p$ where RE is a rare earth and Q is selected from Fe, Co and Ni. Where not specified, various stoichiometries that result in the desired properties may be used. The magnetic layer 230 may be at least ten Angstroms and not more than one hundred Angstroms thick.

The free layer 200 also includes coupling layer 220 that is used to control the magnetic coupling between the layers 210 and 230. For example, the thickness and/or material(s) used in the coupling layer 220 may change the strength of the interaction between the layers 210 and 230. The coupling layer 220 may include at least one ferromagnetic material and at least one nonmagnetic material. The ferromagnetic material(s) are selected from Fe, Co, Ni, FeCo, FeNi, and FeCoNi. The nonmagnetic material may be selected from W, Ta, V, Ge, Mn, ZN, Cu, Ga, Li, Mo, Re, Rh, Se and Ti. For example, the coupling layer 220 may include FeW at the desired stoichiometry. The coupling layer 220 may be at least four Angstroms and not more than twenty Angstroms thick. The strength of the coupling is desired to be weakly dependent on temperature.

FIG. 9 depicts a graph of the magnetic thermal stability coefficient 280 versus temperature for the free layer 200. Although particular slopes and shapes are shown in FIG. 9, these are explanatory purposes only and are not meant to represent specific numerical values except where noted. The magnetic thermal stability coefficient 280 includes two phases 282 and 284 that are analogous to the phases 162/182 and 164/184, respectively. The magnetic thermal stability coefficient 280 goes to zero at $T_2$ and may remain zero above $T_2$. The magnetic thermal stability coefficient 280 is greater than zero below $T_2$ and has a phase transition at $T_1$. The first phase 282 is for temperatures below $T_1$, while the second phase 284 is for temperatures between $T_1$ and $T_2$. At the transition between the phases 282 and 284, the slope of the magnetic thermal stability coefficient 280 is discontinuous. The slope of the first phase 282 and the slope of the second phase 284 differ at the transition temperature $T_1$. The magnetic thermal stability coefficient 280 has a sharp (phase) transition at $T_1$. Below $T_1$, the first phase 282 of the magnetic thermal stability coefficient 280 may change more rapidly. Above $T_1$, the second phase 284 of the magnetic thermal stability coefficient 280 may change more slowly. Thus, the slope of the first phase 282 is generally more negative than the slope of the second phase 284.

The first phase 282 of the magnetic thermal stability coefficient 280 has components due to the magnetic layers 210 and 230. As can be seen in FIG. 9, a portion of the first phase 282 that varies more slowly with temperature is due to the magnetic layer 210. A portion of the magnetic thermal stability coefficient 282 that is due to the magnetic layer 230 varies more quickly. As a result, the total magnetic thermal stability coefficient 280 varies more rapidly with temperature for the first phase 282. After the phase transition at $T_1$, the magnetic thermal stability coefficient is due entirely to magnetic layer 210. Thus, the portion of the magnetic thermal stability coefficient 280 due to the magnetic layer 230 may be considered to go to zero at $T_1$. The remaining portion of the magnetic thermal stability coefficient 280 due to the magnetic layer 210 may be considered to reach zero at $T_2$.

The free layer 200 is programmed and read in an analogous manner to the free layer 130 described above. Thus, the free layer 200 may remain stable during reading and may share the benefits of the free layer 130. The free layer 200 may be switched using thermally assisted spin transfer torque. Thus, a more localized physical phenomenon may be used to write to the free layer 200. Because higher temperature switching may be used, the write current may be reduced and/or switching may be performed more rapidly. As described above, this switching may occur at a magnetic thermal stability coefficient that is greater than zero at least in part because of the multi-phase nature of the magnetic thermal stability constant. The free layer magnetic moment is more stable after switching, during cooling of the free layer 200. Consequently, reliability of programming the free layer 200 may be enhanced.

Figure 10:
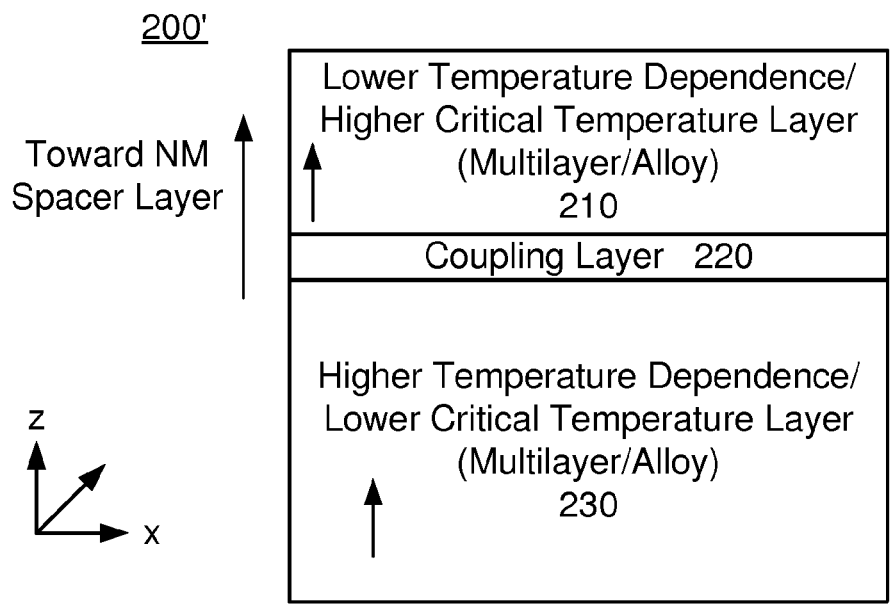
FIG. 10 depicts another exemplary embodiment of a free layer having a multi-phase thermal stability coefficient and which may be programmed using spin transfer torque.

FIG. 10 depicts another exemplary embodiment of a free layer 200' for a magnetic junction such as the magnetic junction 100, 100', 100", 100'" and/or 100"". For clarity, FIG. 10 is not to scale. The free layer 200' is analogous to the free layer 200. Consequently, analogous components are labeled similarly. Thus, the free layer 200' magnetic layers 210, coupling layer 220 and magnetic layer 230 that are analogous to the layers 210, 220 and 230, respectively, for the free layer 200.

In the embodiment shown in FIG. 10, the nonmagnetic spacer layer is on the free layer 200'. Thus, the order of the layers 210, 220 and 230 has been reversed from that shown in FIG. 8. However, operation of the free layer 200 remains substantially the same. Thus, the magnetic thermal stability coefficient for the free layer 200' may be analogous to that of the free layer 200.

The free layer 200' is programmed and read in an analogous manner to the free layers 130 and 200 described above. Thus, the free layer 200' may remain stable during reading and may share the benefits of the free layer 130. The free layer 200' may be switched using a more localized physical phenomenon, switched at a reduced write current and/or switched more rapidly. This switching may occur at a magnetic thermal stability coefficient that is greater than zero, resulting in more stable switching. Consequently, reliability of programming the free layer 200' may be enhanced.

Figure 11:
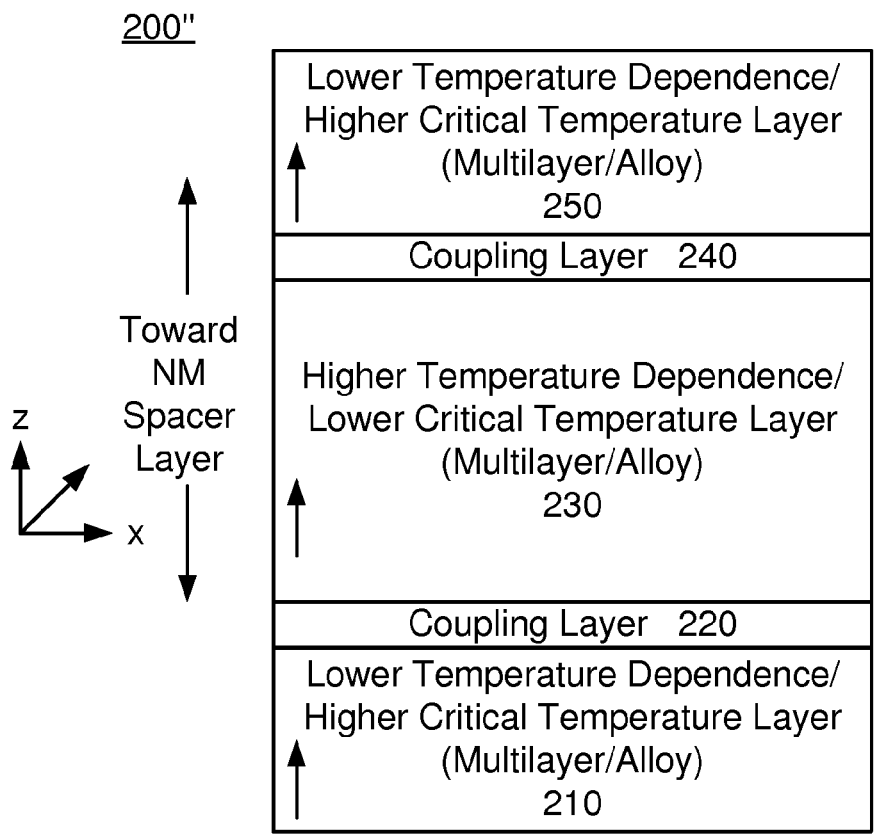
FIG. 11 depicts another exemplary embodiment of a free layer having a multi-phase thermal stability coefficient and which may be programmed using spin transfer torque.

FIG. 11 depicts another exemplary embodiment of a free layer 200" for a magnetic junction such as the magnetic junction 100, 100', 100", 100'" and/or 100"". For clarity, FIG. 11 is not to scale. The free layer 200" is analogous to the free layers 200 and 200'. Consequently, analogous components are labeled similarly. Thus, the free layer 200" magnetic layers 210, coupling layer 220 and magnetic layer 230 that are analogous to the layers 210, 220 and 230, respectively, for the free layer 200.

The free layer 200" also includes an additional coupling layer 240 and an additional lower temperature dependence magnetic layer 250. The coupling layer 240 is analogous to the coupling layer 220. The magnetic layer 250 is analogous to the magnetic layer 210. Thus, structure for the magnetic layer 250 may be selected from the same structures as for the magnetic layer 210. However, the layers 210 and 250 need not be identical in a particular free layer 200".

The free layer 200" is programmed and read in an analogous manner to the free layers 130, 200 and 200' described above. The free layer 200" may be particularly desirable for use in a dual junction. Thus, the free layer 200" may remain stable during reading and may share the benefits of the free layer 130. The free layer 200" may be switched using a more localized physical phenomenon, switched at a reduced write current and/or switched more rapidly. This switching may occur at a magnetic thermal stability coefficient that is greater than zero, resulting in more stable switching. Consequently, reliability of programming the free layer 200" may be enhanced.

Figure 12:
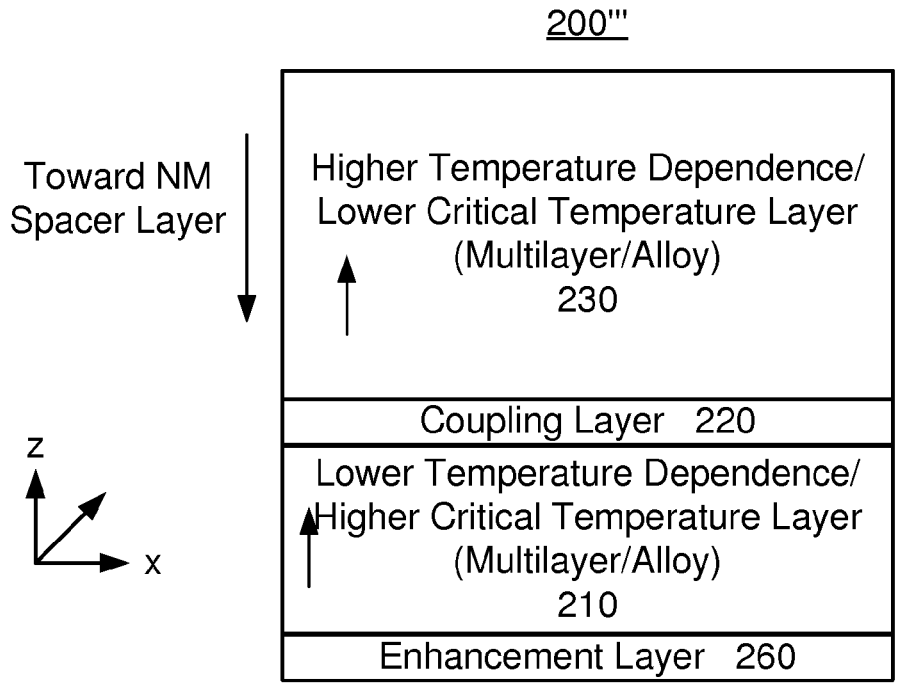
FIG. 12 depicts another exemplary embodiment of a free layer having a multi-phase thermal stability coefficient and which may be programmed using spin transfer torque.

FIG. 12 depicts another exemplary embodiment of a free layer 200'" for a magnetic junction such as the magnetic junction 100, 100', 100", 100'" and/or 100"". For clarity, FIG. 12 is not to scale. The free layer 200"" is analogous to the free layers 200, 200' and 200". Consequently, analogous components are labeled similarly. Thus, the free layer 200'" magnetic layers 210, coupling layer 220 and magnetic layer 230 that are analogous to the layers 210, 220 and 230, respectively, for the free layer 200.

The free layer 200" also includes an enhancement layer 260. For example, the layer 260 may be a high Heisenberg exchange layer 260. The enhancement layer is between the magnetic layer 210 and the nonmagnetic spacer layer (not shown). The enhancement layer 260 is generally desired to be a pure ferromagnetic alloy (or element) with no nonmagnetic constituents. Examples of such materials that may be used in the enhancement layer 260 include but are not limited Fe, CoFe (with various concentrations), Ni, NiFe (with various concentrations), CoNi (with various concentrations), Co, FeMn (with various concentrations), CoMn (with various concentrations) and NiMn (with various concentrations). The enhancement layer 260 is thus desired to be ferromagnetic.

The free layer 200''' is programmed and read in an analogous manner to the free layers 130, 200, 200' and 200'' described above. Thus, the free layer 200''' may remain stable during reading and may share the benefits of the free layer 130. The free layer 200''' may be switched using a more localized physical phenomenon, switched at a reduced write current and/or switched more rapidly. This switching may occur at a magnetic thermal stability coefficient that is greater than zero, resulting in more stable switching. Consequently, reliability of programming the free layer 200''' may be enhanced.

Figure 13:
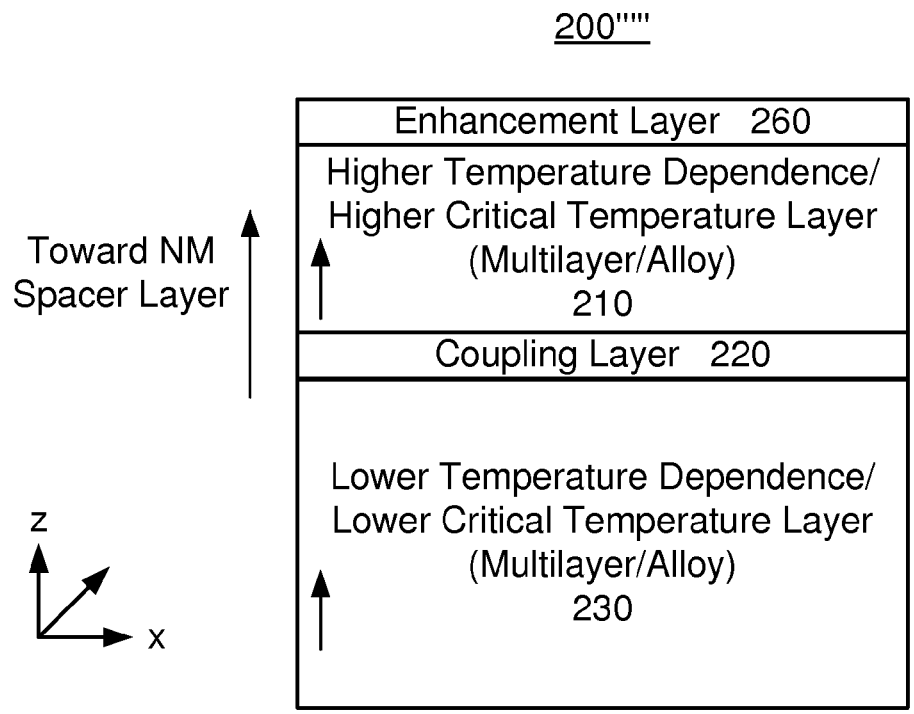
FIG. 13 depicts another exemplary embodiment of a free layer having a multi-phase thermal stability coefficient and which may be programmed using spin transfer torque.

FIG. 13 depicts another exemplary embodiment of a free layer 200''' for a magnetic junction such as the magnetic junction 100, 100', 100'', 100''' and/or 100''''. For clarity, FIG. 13 is not to scale. The free layer 200''' is analogous to the free layers 200, 200', 200'' and 200'''. Consequently, analogous components are labeled similarly. Thus, the free layer 200''' magnetic layers 210, coupling layer 220, magnetic layer 230 and enhancement layer 260 that are analogous to the layers 210, 220, 230, and 260. Although the order of the layers 210, 220, 230 and 260 with respect to a nonmagnetic spacer is unchanged, the order with respect to an underlying substrate has been reversed.

The free layer 200''' is programmed and read in an analogous manner to the free layers 130, 200, 200', 200'' and 200''' described above. Thus, the free layer 200''' may remain stable during reading and may share the benefits of the free layer 130. The free layer 200''' may be switched using a more localized physical phenomenon, switched at a reduced write current and/or switched more rapidly. This switching may occur at a magnetic thermal stability coefficient that is greater than zero, resulting in more stable switching. Consequently, reliability of programming the free layer 200''' may be enhanced.

Figure 14:
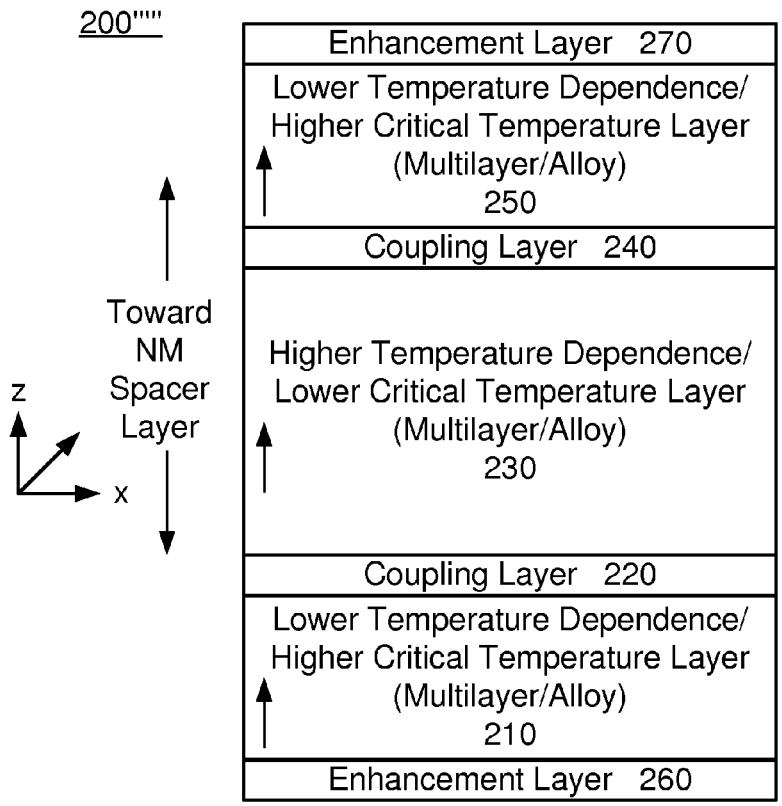
FIG. 14 depicts another exemplary embodiment of a free layer having a multi-phase thermal stability coefficient and which may be programmed using spin transfer torque.

FIG. 14 depicts another exemplary embodiment of a free layer 200'''' for a magnetic junction such as the magnetic junction 100, 100', 100'', 100''' and/or 100''''. For clarity, FIG. 14 is not to scale. The free layer 200'''' is analogous to the free layers 200, 200', 200'', 200''' and 200''''. Consequently, analogous components are labeled similarly. Thus, the free layer 200'''' magnetic layers 210, coupling layer 220, magnetic layer 230, coupling layer 240, magnetic layer 250 and enhancement layer 260 that are analogous to the layers 210, 220, 230, 240, 250 and 260, respectively.

The free layer 200'''' also includes an enhancement layer 270 that is analogous to the enhancement layer 260. For example, the layer 270 may be a high Heisenberg exchange layer. The enhancement layer is between the magnetic layer 250 and an additional nonmagnetic spacer layer (not shown).

The free layer 200'''' is programmed and read in an analogous manner to the free layers 130, 200, 200', 200'' and 200''' described above. The free layer 200'''' may be particularly desirable for use in a dual junction. The free layer 200'''' may remain stable during reading and may share the benefits of the free layer 130. The free layer 200'''' may be switched using a more localized physical phenomenon, switched at a reduced write current and/or switched more rapidly. This switching may occur at a magnetic thermal stability coefficient that is greater than zero, resulting in more stable switching. Consequently, reliability of programming the free layer 200'''' may be enhanced.

Figure 15:
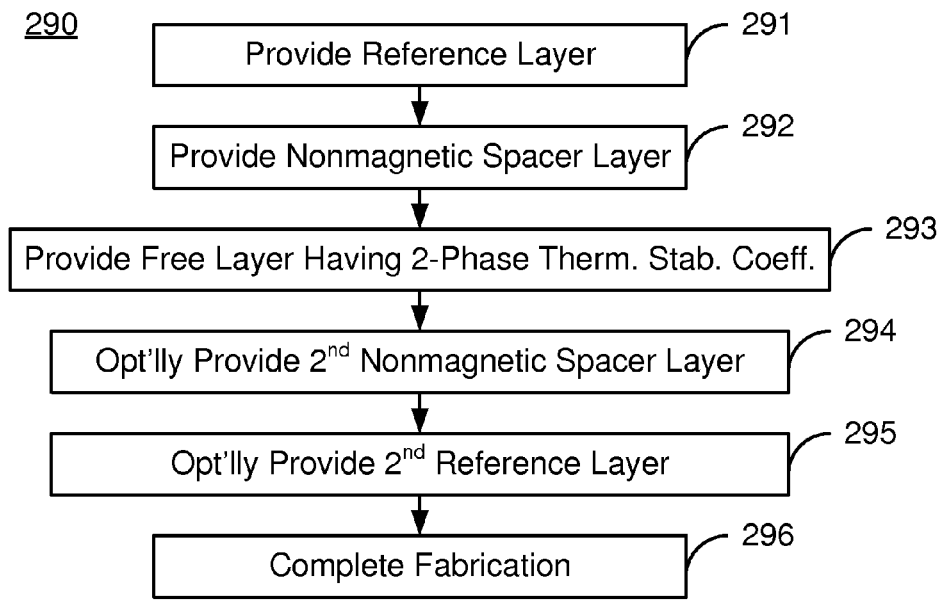
FIG. 15 is a flow chart depicting an exemplary embodiment of a method for providing a magnetic junction usable in an electronic device programmable using spin transfer torque and for which the free layer has a multi-phase magnetic thermal stability coefficient.

FIG. 15 depicts an exemplary embodiment of a method 290 for fabricating a magnetic junction. For simplicity, some steps may be omitted or combined. The method 290 is described in the context of the magnetic junctions 100, 100', 100'', 100''' and 100''''. However, the method 290 may be used on other magnetic junctions. Further, the method 290 may be incorporated into fabrication of magnetic memories. Thus the method 290 may be used in manufacturing a STT-MRAM or other magnetic memory.

The reference layer 110/110' that may be a SAF is provided, via step 291. Step 291 may include depositing the desired materials at the desired thickness of the reference layer 110/110'. The nonmagnetic layer 120 is provided, via step 292. Step 292 may include depositing the desired nonmagnetic materials. In addition, the desired thickness of material may be deposited in step 292. The free layer 130//200/200'/200''/200'''/200''''/200''''' is provided, via step 293. Step 293 thus includes depositing the material(s) which result in a multi-phase magnetic thermal stability coefficient. Thus, multilayer(s) or alloy(s) with sublattices may be provided in step 293. The nonmagnetic layer 140 may optionally be provided, via step 294. The desired reference layer 150/150' may optionally be provided, via step 295. Fabricating of the magnetic junction 100, 100', 100'', 100''' and/or 100'''' may then be completed, via step 296. Consequently, the benefits of the magnetic junction(s) 100, 100', 100'', 100''' and/or 100'''' as well as the benefits of the free layers 130, 130', 200, 200', 200'', 200''', 200'''' and/or 200''''' may be achieved.

Figure 16:
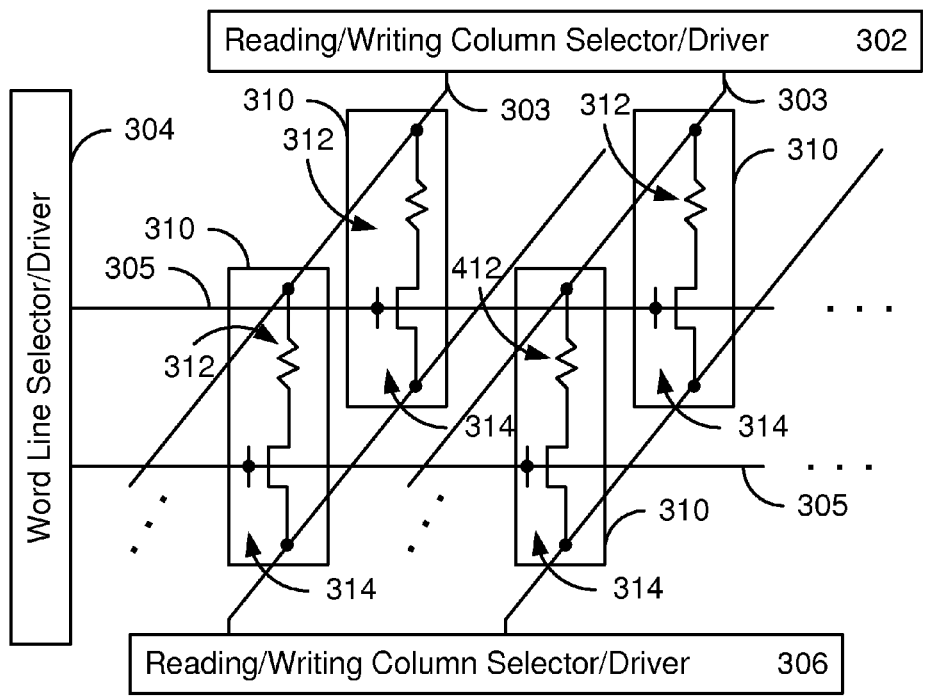
FIG. 16 depicts an exemplary embodiment of a memory utilizing magnetic junctions in the memory element(s) of the storage cell(s).

FIG. 16 depicts an exemplary embodiment of a memory 300 that may use one or more of the magnetic junctions 100, 100', 100'', 100''' and/or 100'''' and the free layers 130, 200, 200', 200'', 200''', 200'''' and/or 200'''''. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 100, 100', 100'', 100''' and/or 100'''' and the free layers 130, 200, 200', 200'', 200''', 200'''' and/or 200'''''. Thus, the free layer of the magnetic junctions 312 has a multi-phase magnetic thermal stability coefficient. Although one magnetic junction 312 is shown per cell 310, in other embodiments, another number of magnetic junctions 312 may be provided per cell. Further, although not shown, in some embodiments, the memory 300 may include heaters and associated electronics or some other mechanism used to heat the magnetic junctions 312. Elevated temperatures of the magnetic junctions 312 during programming allow for operation as discussed above. As such, the magnetic memory 300 may enjoy the benefits described above.

Figure 17:
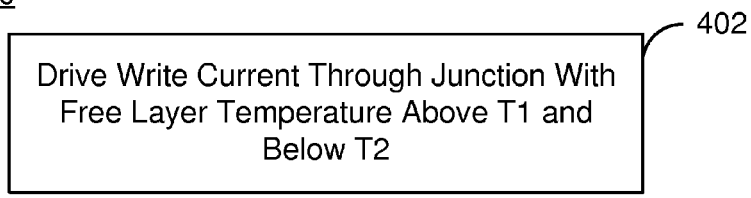
FIG. 17 depicts an exemplary embodiment of a method for programming a magnetic junction usable in an electronic device programmable using spin transfer torque and for which the free layer has a multi-phase magnetic thermal stability coefficient.

FIG. 17 depicts an exemplary embodiment of a method 400 for programming a magnetic junction. For simplicity, some steps may be omitted or combined. The method 400 is described in the context of the magnetic junctions 100, 100', 100'', 100''' and 100''''. However, the method 400 may be used on other magnetic junctions.

A write current is driven through the free layer at elevated temperatures, via step 402. This is performed at least for the free layer temperatures corresponding to a portion of the second phase of the magnetic thermal stability coefficient. Further, the temperatures for which current is driven through the magnetic junction correspond to magnetic thermal stability coefficients that are greater than zero. For example, the free layer magnetic thermal stability coefficient may be at least twenty and not more than forty for at least part of step 402. Note that step 402 does not indicate how the free layer is heated for step 402. The heating may be accomplished using the write current only. In such embodiments, the write current is terminated before the magnetic thermal stability coefficient reaches zero. In other embodiments, heating may also involve a separate heat source, such as a current driven through a heater. In such embodiments, both the write current and heater power are terminated before the magnetic thermal stability coefficient reaches zero.

Using the method 400, the magnetic junction 100, 100', 100", 100'" and/or 100"" may be more reliably and easily written. Because the write current is driven through the magnetic junction 100, 100', 100", 100'" and/or 100"" at elevated temperatures and lower magnetic thermal stability coefficients, switching may be more rapidly achieved at lower temperatures. In addition, because the write current is terminated while the magnetic thermal stability coefficient is nonzero, switching is more stable. Thus performance and reliability of the write operation may be improved.

Figure 18:
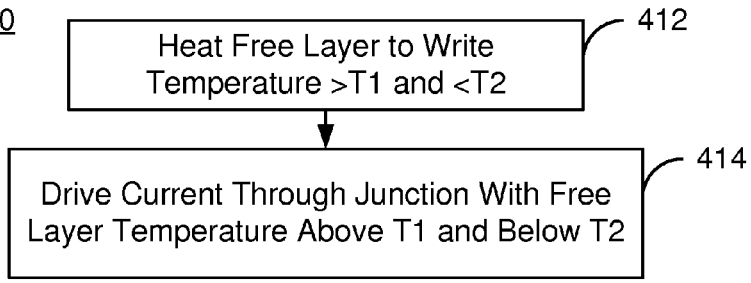
FIG. 18 depicts an exemplary embodiment of a method for programming a magnetic junction usable in an electronic device programmable using spin transfer torque and for which the free layer has a multi-phase magnetic thermal stability coefficient.

FIG. 18 depicts an exemplary embodiment of a method 410 for fabricating a magnetic junction. For simplicity, some steps may be omitted or combined. The method 410 is described in the context of the magnetic junctions 100, 100', 100", 100'" and 100"". However, the method 410 may be used on other magnetic junctions.

The free layer is heated to temperature(s) corresponding to a phase that has a reduced temperature dependence, via step 412. Step 412 may be accomplished using a heater or by driving the write current through the magnetic junction 100, 100', 100", 100'" and/or 100"".

A write current is driven through the free layer at elevated temperatures and terminated before the magnetic thermal stability coefficient reaches zero, via step 414. For example, the write current may be terminated while the magnetic thermal stability coefficient is at least twenty.

Using the method 410, the magnetic junction 100, 100', 100", 100'" and/or 100"" may be more reliably and easily written. Because the write current is driven through the magnetic junction 100, 100', 100", 100'" and/or 100"" at elevated temperatures and lower magnetic thermal stability coefficients, switching may be more rapidly achieved at lower temperatures. In addition, because the write current is terminated while the magnetic thermal stability coefficient is nonzero, switching is more stable. Thus performance and reliability of the write operation may be improved.

A method and system for providing a magnetic junction and an electronic device, such as one including a memory fabricated using the magnetic junction, has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   at least one reference layer;
   at least one nonmagnetic spacer layer; and
   a free layer, the at least one nonmagnetic spacer layer being between the free layer and the at least one reference layer, the free layer having a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, the magnetic thermal stability coefficient being zero above the second temperature and greater than zero below the second temperature, the first slope and second slope being unequal at the first temperature;
   wherein the free layer is switchable between a plurality of stable magnetic states when a write current is passed through the magnetic junction.

2. The magnetic junction of claim 1 wherein the second phase magnetic thermal stability coefficient goes to zero at the second temperature.

3. The magnetic junction of claim 1 wherein the second temperature is at least one hundred degrees Celsius.

4. The magnetic junction of claim 1 wherein the free layer is configured to be written at a write temperature above the first temperature, below the second temperature and corresponding to the second phase magnetic thermal stability coefficient being at least twenty and not more than forty.

5. The magnetic junction of claim 1 wherein at least a portion of the first slope is more negative than at least a portion of the second slope.

6. A magnetic junction for use in a magnetic device comprising:
   at least one reference layer;
   at least one nonmagnetic spacer layer; and
   a free layer, the at least one nonmagnetic spacer layer being between the free layer and the at least one reference layer, the free layer having a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, the magnetic thermal stability coefficient being zero above the second temperature and greater than zero below the second temperature, the first slope and second slope being unequal at the first temperature;
   wherein the free layer is switchable between a plurality of stable magnetic states when a write current is passed through the magnetic junction
   wherein the first temperature is at least one hundred fifty degrees Celsius and not more than two hundred degrees Celsius and wherein the second temperature is at least three hundred and not more than eight hundred degrees Celsius.

7. A magnetic junction for use in a magnetic device comprising:
   at least one reference layer;
   at least one nonmagnetic spacer layer; and
   a free layer, the at least one nonmagnetic spacer layer being between the free layer and the at least one reference layer, the free layer having a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, the magnetic thermal stability coefficient being zero above the second temperature and greater than zero below the second temperature, the first slope and second slope being unequal at the first temperature, the free layer including a plurality of magnetic layers, a first magnetic layer of the plurality of magnetic layers corresponding to a first portion of the first phase magnetic thermal stability coefficient, a second magnetic layer of the plurality of magnetic layers having the second phase magnetic thermal stability coefficient and corresponding to a second portion of the first phase magnetic thermal stability coefficient;

wherein the free layer is switchable between a plurality of stable magnetic states when a write current is passed through the magnetic junction.

8. The magnetic junction of claim 7 wherein and the second magnetic layer is closer to the at least one nonmagnetic spacer than the first magnetic layer.

9. The magnetic junction of claim 7 wherein the free layer further includes at least one insertion layer between the second layer and the at least one nonmagnetic spacer layer.

10. The magnetic junction of claim 7 wherein the plurality of magnetic layers are interleaved with at least one coupling layer.

11. The magnetic junction of claim 10 wherein the coupling layer includes at least one ferromagnetic material and at least one nonmagnetic material, the at least one ferromagnetic material being selected from Fe, Co, Ni, FeCo, FeNi, and FeCoNi and the at least one nonmagnetic material being selected from W, Ta, V, Ge, Mn, ZN, Cu, Ga, Li, Mo, Re, Rh, Se and Ti.

12. The magnetic junction of claim 7 wherein the first magnetic layer includes at least one of a $[Co_aT_b/Pd]_i$ bilayer, $Co_cT_dPd_e$, a $[Fe_fX_g/Pd]_j$ bilayer, $Fe_hX_iPd_o$, a $[Co_pY_q/Pt]_k$ bilayer, $Co_rY_sPt_t$, a $[Fe_uZ_v/Pt]_m$ bilayer, $Fe_wZ_xPt_y$, a $[Co/Ni]_n$ bilayer, MnAl, MnGa, MnIn, MnGe, and $RE_oQ_p$ where i, j, k, m and n are integers greater than zero, where T, X, Y and Z are nonmagnetic metals, wherein RE is a rare earth and Q is selected from Fe, Co and Ni, where a+b=1, c+d+e=1, f+g=1, h+l+o=1, p+q=1, r+s+t=1, u+v=1, w+x+y=1 and where a, c, f, h, o, r, u and w are all greater than zero.

13. The magnetic junction of claim 7 wherein the second magnetic layer includes at least one of a $Co_aFe_bB_c$/W/Fe/W/$Co_dFe_eB_f$ multilayer, a Fe/$Co_hFe_iB_j$/W//Fe/W/$Co_kFe_mB_n$ multilayer, a $Co_oFe_p$/$Co_qFe_rB_s$/W/Fe/W/$Co_tFe_uB_v$ multilayer, where a+b+c=1, d+e+f=1, h+i+j=1, k+m+n=1, o+p=1, q+r+s=1, t+u+v=1 and where a, b, d, e, h, l, k, m, o, p, q, r, t and u are greater than zero.

14. The magnetic junction of claim 7 wherein the first magnetic layer is magnetically coupled with the second magnetic layer.

15. A magnetic junction for use in a magnetic device comprising:

at least one reference layer;
at least one nonmagnetic spacer layer; and
a free layer, the at least one nonmagnetic spacer layer being between the free layer and the at least one reference layer, the free layer having a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, the magnetic thermal stability coefficient being zero above the second temperature and greater than zero below the second temperature, the first slope and second slope being unequal at the first temperature, the first phase having a first portion and a second portion, the first portion reaching zero at the first temperature, the second phase magnetic thermal stability coefficient reaching zero at the second temperature, the second phase magnetic thermal stability coefficient corresponding to the second portion of the first magnetic thermal stability coefficient below the first temperature; and wherein the free layer is switchable between a plurality of stable magnetic states when a write current is passed through the magnetic junction.

16. An electronic device comprising:

a magnetic memory including a plurality of magnetic storage cells and a plurality of bit lines, each of the plurality of magnetic storage cells including at least one magnetic junction, the at least one magnetic junction including at least one reference layer, at least one nonmagnetic spacer layer, and a free layer, the at least one nonmagnetic spacer layer being between the free layer and the at least one reference layer, the free layer having a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, at least a portion of the first slope being more negative than at least a portion of the second slope, the first slope and the second slope being unequal at the first temperature the magnetic thermal stability coefficient being zero above the second temperature and greater than zero below the second temperature, the at least one magnetic junction being configured such that the free layer is switchable between a plurality of stable magnetic states when a write current is passed through the magnetic junction;

wherein the free layer includes a plurality of magnetic layers interleaved and sandwiching with at least one coupling layer, a first magnetic layer of the plurality of magnetic layers having the first phase magnetic thermal stability coefficient and a second magnetic layer of the plurality of magnetic layers having the second phase magnetic thermal stability coefficient.

17. A method for programming a magnetic junction for use in a magnetic device comprising:

driving a write current through a magnetic junction including at least one reference layer, a free layer switchable between a plurality of stable magnetic states when the write current is passed through the magnetic junction and at least one nonmagnetic spacer layer between the free layer and the at least one reference layer, the free layer having a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the first slope and the second slope being unequal at the first temperature, the magnetic thermal stability coefficient being zero above the second temperature and greater than zero below the second temperature, the second temperature being greater than the first temperature, at least a portion of the first slope being more negative than at least a portion of the second slope;

wherein the free layer reaches a write temperature between the first temperature and the second temperature during the step of driving the write current; and wherein the write temperature corresponds to the magnetic thermal stability coefficient being at least twenty and not more than forty.

\* \* \* \* \*